(12) United States Patent
Kakuma et al.

(10) Patent No.: US 10,580,163 B2
(45) Date of Patent: Mar. 3, 2020

(54) DISPLACEMENT DETECTING APPARATUS, DISPLACEMENT DETECTING METHOD AND SUBSTRATE PROCESSING APPARATUS

(71) Applicant: SCREEN Holdings Co., Ltd., Kyoto (JP)

(72) Inventors: Hiroaki Kakuma, Kyoto (JP); Kazuhiro Kitamura, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 84 days.

(21) Appl. No.: 15/663,116

(22) Filed: Jul. 28, 2017

(65) Prior Publication Data

US 2018/0053319 A1 Feb. 22, 2018

(30) Foreign Application Priority Data

Aug. 19, 2016 (JP) .................. 2016-160979

(51) Int. Cl.
*G06T 7/73* (2017.01)
*H01L 21/67* (2006.01)
(Continued)

(52) U.S. Cl.
CPC .............. *G06T 7/74* (2017.01); *B05B 12/124* (2013.01); *B05B 13/0405* (2013.01); *G06T 7/73* (2017.01);
(Continued)

(58) Field of Classification Search
CPC ............. G06T 7/73; G06T 2207/30148; G06T 2207/30204; G06T 7/74; G06K 9/6202; B05B 12/124; B05B 13/0405; H01L 21/67017; H01L 21/67051; H01L 21/6708; H01L 21/67259; H01L 21/681
See application file for complete search history.

(56) References Cited

U.S. PATENT DOCUMENTS 4,943,716 A 7/1990 Ichikawa et al. ........ 250/231.16
4,983,825 A 1/1991 Ichikawa et al. ........ 250/231.16
(Continued)

FOREIGN PATENT DOCUMENTS

CN 1285035 A 2/2001
CN 104851822 A 8/2015
(Continued)

*Primary Examiner* — Mekonen T Bekele
(74) *Attorney, Agent, or Firm* — Ostrolenk Faber LLP

(57) ABSTRACT

A displacement detecting apparatus according to the invention comprises: a mover which moves and positions a positioning object; an imager which images an image including an imaging object which is the positioning object or an object displacing integrally with the positioning object as the positioning object is displaced; and a displacement detector which detects the imaging object from the image imaged by the imager and detects a displacement of the positioning object based on the position of the imaging object detected in the image, wherein the displacement detector obtains a displacement amount of the positioning object with respect to a predetermined reference position from a value obtained by multiplying a distance between the position of the imaging object and the reference position in the image by a coefficient determined according to size of the imaging object in the image.

14 Claims, 14 Drawing Sheets

US 10,580,163 B2
Page 2

(51) Int. Cl.
  *H01L 21/68* (2006.01)
  *B05B 12/12* (2006.01)
  *B05B 13/04* (2006.01)

(52) U.S. Cl.
  CPC .... *H01L 21/6708* (2013.01); *H01L 21/67017* (2013.01); *H01L 21/67051* (2013.01); *H01L 21/67259* (2013.01); *H01L 21/681* (2013.01); *G06T 2207/30148* (2013.01); *G06T 2207/30204* (2013.01)

(56) References Cited

U.S. PATENT DOCUMENTS

| | | | |
|---|---|---|---|
| 4,985,623 A | 1/1991 | Ichikawa et al. | 250/231.16 |
| 6,185,343 B1 | 2/2001 | Ikeda et al. | 382/291 |
| 6,385,334 B1* | 5/2002 | Saneyoshi | H04N 13/111 |
| | | | 382/154 |
| 6,525,805 B2* | 2/2003 | Heinle | G03B 27/42 |
| | | | 355/53 |
| 6,718,057 B1 | 4/2004 | Mori | 382/141 |
| 8,213,744 B2 | 7/2012 | Yano | 382/294 |
| 8,356,951 B2* | 1/2013 | Noda | H01L 21/67253 |
| | | | 396/611 |
| 10,402,997 B2* | 9/2019 | Kitamura | G06T 7/73 |
| 2002/0059686 A1* | 5/2002 | Uemukai | B08B 1/04 |
| | | | 15/77 |
| 2002/0167649 A1* | 11/2002 | Heinle | G03B 27/42 |
| | | | 355/53 |
| 2007/0036425 A1* | 2/2007 | Enokido | B23K 20/004 |
| | | | 382/151 |
| 2007/0171033 A1 | 7/2007 | Nagaoka et al. | 340/435 |
| 2011/0286738 A1* | 11/2011 | Noda | H01L 21/6715 |
| | | | 396/611 |
| 2013/0215263 A1* | 8/2013 | Ariga | G06T 3/4038 |
| | | | 348/135 |
| 2013/0216141 A1* | 8/2013 | Ushiba | G01B 15/00 |
| | | | 382/218 |
| 2015/0235368 A1* | 8/2015 | Kakuma | G06T 7/254 |
| | | | 348/135 |
| 2017/0116721 A1* | 4/2017 | Kitamura | G06T 7/73 |

FOREIGN PATENT DOCUMENTS

| | | |
|---|---|---|
| CN | 103234454 B | 3/2016 |
| JP | 01-216213 A | 8/1989 |
| JP | 06-226668 A | 8/1994 |
| JP | 11-73510 A | 3/1999 |
| JP | 11-295032 A | 10/1999 |
| JP | 2007-213561 A | 8/2007 |
| JP | 2015-152475 A | 8/2015 |

* cited by examiner

F I G. 1 4

| NOZZLE NUMBER | REFERENCE POSITION | | |
|---|---|---|---|
| | A | B | C |
| 1 | F1a(X) | F1b(X) | F1c(X) |
| 2 | F2a(Y) | F2b(Y) | F2c(Y) |
| 3 | F3a(X, Y) | F3b(X, Y) | F3c(X, Y) |

DISPLACEMENT DETECTING APPARATUS, DISPLACEMENT DETECTING METHOD AND SUBSTRATE PROCESSING APPARATUS

CROSS REFERENCE TO RELATED APPLICATION

The disclosure of Japanese Patent Application No. 2016-160979 filed on Aug. 19, 2016 including specification, drawings and claims is incorporated herein by reference in its entirety.

BACKGROUND OF THE INVENTION

1. Field of the Invention

This invention relates to a technique for detecting a displacement of a movable positioning object with respect to a reference position.

2. Description of the Related Art

As a technique for detecting the position of a movable positioning object or determining whether or not the positioning object is positioned at a designated position, the positioning object is imaged using an imager such as a camera and the position of the positioning object in an image is detected by an image analysis. For example, in a technique described in JP 2015-152475A, a processing nozzle configured to be movable with respect to a substrate and discharge a liquid or the like is a positioning object. A displacement amount in an actual space is approximately obtained by multiplying a displacement amount of the processing nozzle in an image imaged by the camera by a proportionality coefficient corresponding to an imaging magnification.

In a substrate processing apparatus as in the above conventional technique, whether or not a processing nozzle as a positioning object is satisfactorily positioned is determined based on whether or not a displacement amount of the positioning object is within an allowable range when a proper position designated in advance is a reference position. The displacement amount evaluated at this time has to be naturally that in an actual space.

On the other hand, a positional displacement amount of the positioning object detected in the image, i.e. a distance between the positioning object and the reference position, does not necessary coincide with the displacement amount in the actual space. Specifically, due to a movement mode of the positioning object and a positional relationship with an imager, there is a nonlinear relationship between the magnitude of the positional displacement amount detected in the image and the displacement amount in the actual space.

For example, even if the displacement amount in the actual space is the same, the displacement in the image is relatively large when the positioning object is relatively close to the imager, whereas the displacement in the image is small when the positioning object is more distant from the imager. Thus, it is necessary to make a coefficient for converting the displacement amount in the image into the displacement amount in the actual space different depending on the distance between the positioning object and the imager. As just described, in a method for obtaining a displacement amount in an actual space by multiplying a displacement amount in an image by a constant proportionality coefficient, detection accuracy is possibly insufficient.

SUMMARY OF THE INVENTION

This invention was developed in view of the above problem and an object thereof is to provide a technique capable of detecting a displacement of a positioning object with respect to a reference position in an actual space with excellent accuracy.

To achieve the above object, one aspect of this invention is directed to a displacement detecting apparatus. The displacement detecting apparatus comprises: a mover which moves and positions a positioning object; an imager which images an image including an imaging object which is the positioning object or an object displacing integrally with the positioning object as the positioning object is displaced; and a displacement detector which detects the imaging object from the image imaged by the imager and detects a displacement of the positioning object based on the position of the imaging object detected in the image, wherein the displacement detector obtains a displacement amount of the positioning object with respect to a predetermined reference position from a value obtained by multiplying a distance between the position of the imaging object and the reference position in the image by a coefficient determined according to size of the imaging object in the image.

Further, another aspect of this invention is directed to a displacement detecting method for detecting a displacement of a positioning object moved and positioned by a mover. The displacement detecting method comprises: imaging an image including an imaging object which is the positioning object or an object displacing integrally with the positioning object as the positioning object is displaced; detecting the imaging object from the image; and detecting a displacement of the positioning object with respective to a predetermined reference position based on the position of the imaging object detected in the image, wherein a displacement amount of the positioning object is obtained from a value obtained by multiplying a distance between the position of the imaging object and the reference position in the image by a coefficient determined according to size of the imaging object in the image.

In the inventions thus configured, the displacement amount of the positioning object in an actual space can be accurately obtained without depending on a distance between the imaging object and the imager in dealing with a problem that a relationship of the displacement amount in the image and the displacement amount in the actual space changes depending on the distance between the imaging object and the imager. This is for the following reason.

When the imaging object is close to the imager, an area taken up by the imaging object in the image is relatively large and a displacement in the image when the imaging object moves is relatively large. On the other hand, when the imaging object is distant from the imager, the imaging object is reflected to be relatively small in the image and a movement in the actual space also appears to be small in the image. In other words, even if the displacement amount in the image expressed, for example, by a pixel number is the same, the displacement amount in the actual space is larger when the imaging object is distant from the imager than when the imaging object is close to the imager.

Accordingly, in the invention, the displacement amount of the imaging object in the actual space is obtained based on the value obtained by multiplying the distance between the position of the imaging object detected in the image and the reference position by the coefficient determined according to the size of the imaging object in the image. By doing so, in converting the displacement amount detected in the image into the displacement amount in the actual space, the coefficient according to the size of the imaging object in the image, i.e. the distance between the imaging object and the imager can be applied. By performing conversion with the distance between the imaging object and the imager reflected on the coefficient in this way, the displacement amount of the positioning object in the actual space can be accurately obtained by suppressing a calculation error due to a difference in distance.

Further, another aspect of this invention is directed to a substrate processing apparatus. The substrate processing apparatus comprises: a holder which holds a work to be processed; a nozzle which discharges and supplies a fluid to the work; and the displacement detecting apparatus of the above configuration using the nozzle as the positioning object. In such an invention, since the position of the nozzle with respect to the work is accurately obtained from an image, the work can be processed with the position of the nozzle properly managed and the process can satisfactorily proceed.

As described above, in the invention, the distance between the imaging object and the imager is reflected on the coefficient in converting the displacement amount in the image into the displacement amount in the actual space. By doing so, a calculation error due to a difference in distance can be suppressed and the displacement amount of the positioning object in the actual space can be accurately obtained.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 14 is a drawing showing an example of the correction table.

DETAILED DESCRIPTION OF THE PREFERRED EMBODIMENTS

A substrate processing system comprising a substrate processing apparatus to which the invention is applicable will now be briefly described. In the following, a substrate may be any one of various types of substrates such as a semiconductor substrate, a glass substrate for photo mask, a glass substrate for liquid crystal display, a glass substrate for plasma display, a substrate for FED (Field Emission Display), an optical disk substrate, a magnetic disk substrate and a magneto-optic disk substrate. While the following will describe as an example a substrate processing system used primarily for processing of a semiconductor substrate with reference to drawings, the invention is applicable to processing of various types of substrates mentioned above.

Figure 1:
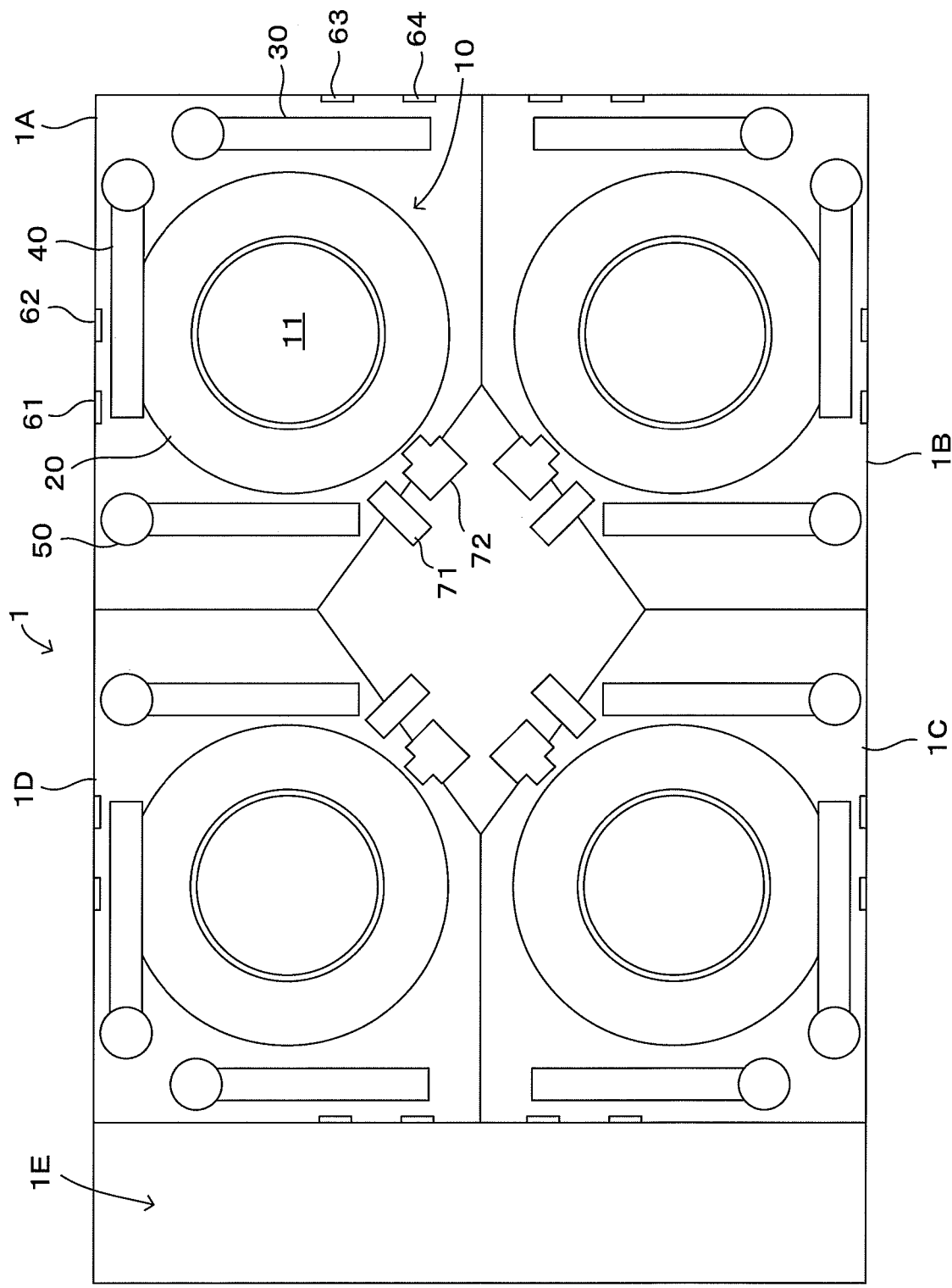
FIG. 1 is a schematic drawing showing the structure of a substrate processing system according to an embodiment of the invention.
Figure 3:
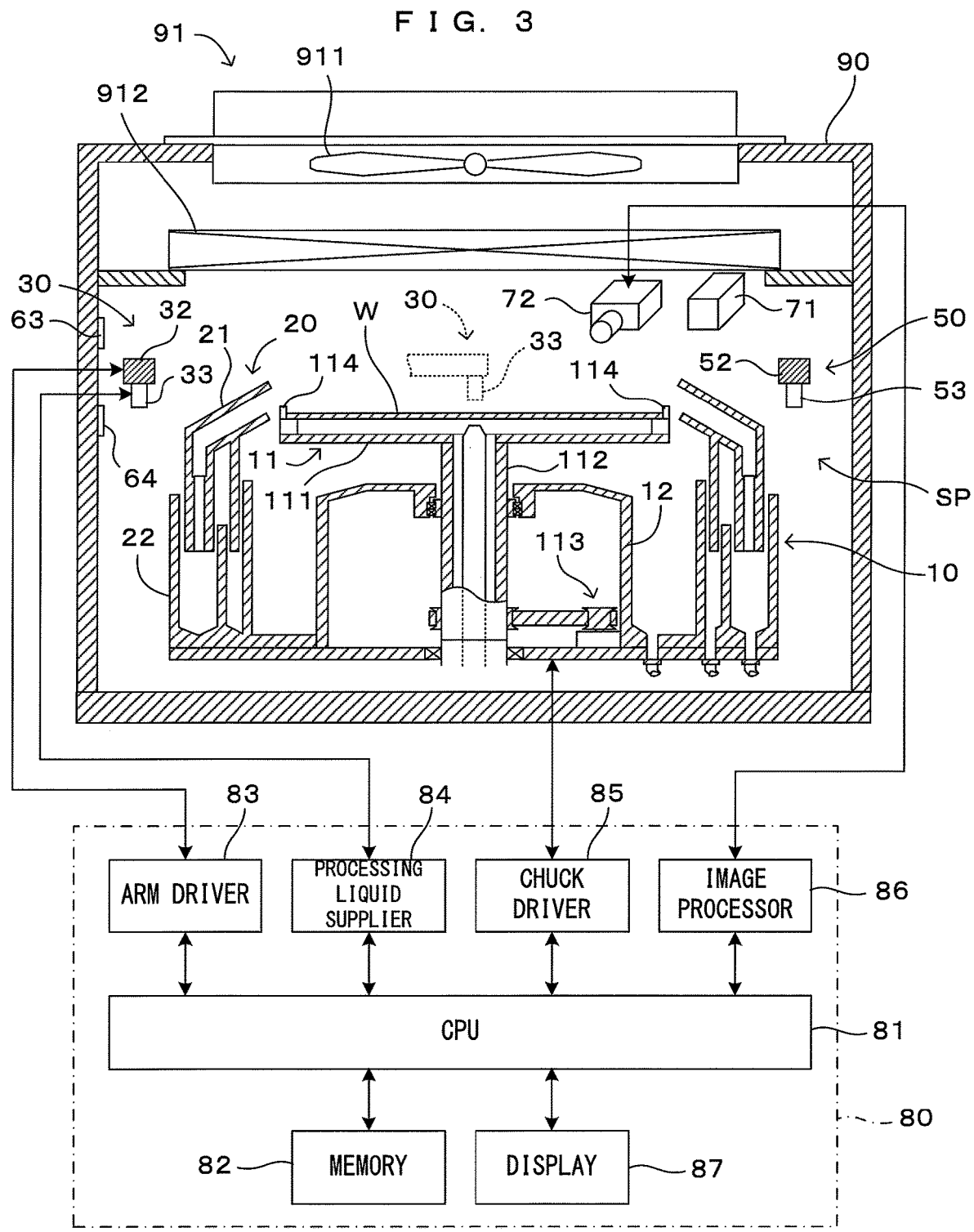
FIG. 3 is a drawing showing the cross section of FIG. 2 taken along the arrow A-A and the structure of the controller of the substrate processing unit.

FIG. 1 is a schematic drawing showing the structure of a substrate processing system according to an embodiment of the invention. To be more specific, FIG. 1 is a plan view which shows an embodiment of a substrate processing system comprising a substrate processing apparatus to which the invention is applied in a preferable fashion. The substrate processing system 1 comprises substrate processing units 1A, 1B, 1C and 1D, an indexer part 1E and a controller 80 (FIG. 3). The substrate processing units 1A, 1B, 1C and 1D are capable of executing predetermined processing of a substrate independently of each other. The indexer part 1E is equipped with an indexer robot (not shown) which is for transferring the substrate to the substrate processing units 1A, 1B, 1C and 1D from outside and vice versa. The controller 80 controls operations of the entire system. Any number of substrate processing units may be disposed, and more than one layers each housing four substrate processing units which are arranged horizontally may be stacked one atop the other.

The substrate processing units 1A, 1B, 1C and 1D are identical to each other with respect to structural elements and operations, although the layout of the structural elements is partially different depending upon the locations of these units within the substrate processing system 1. The following will describe the structure and operations of the substrate processing unit 1A but will omit describing the other semiconductor processing units 1B, 1C and 1D in detail. As described below, each of the substrate processing units 1A through 1D has a function of a "substrate processing apparatus" which performs a predetermined process to the substrate and a function of a "displacement detecting apparatus" of the invention using a processing nozzle as a "positioning object".

Figure 2:
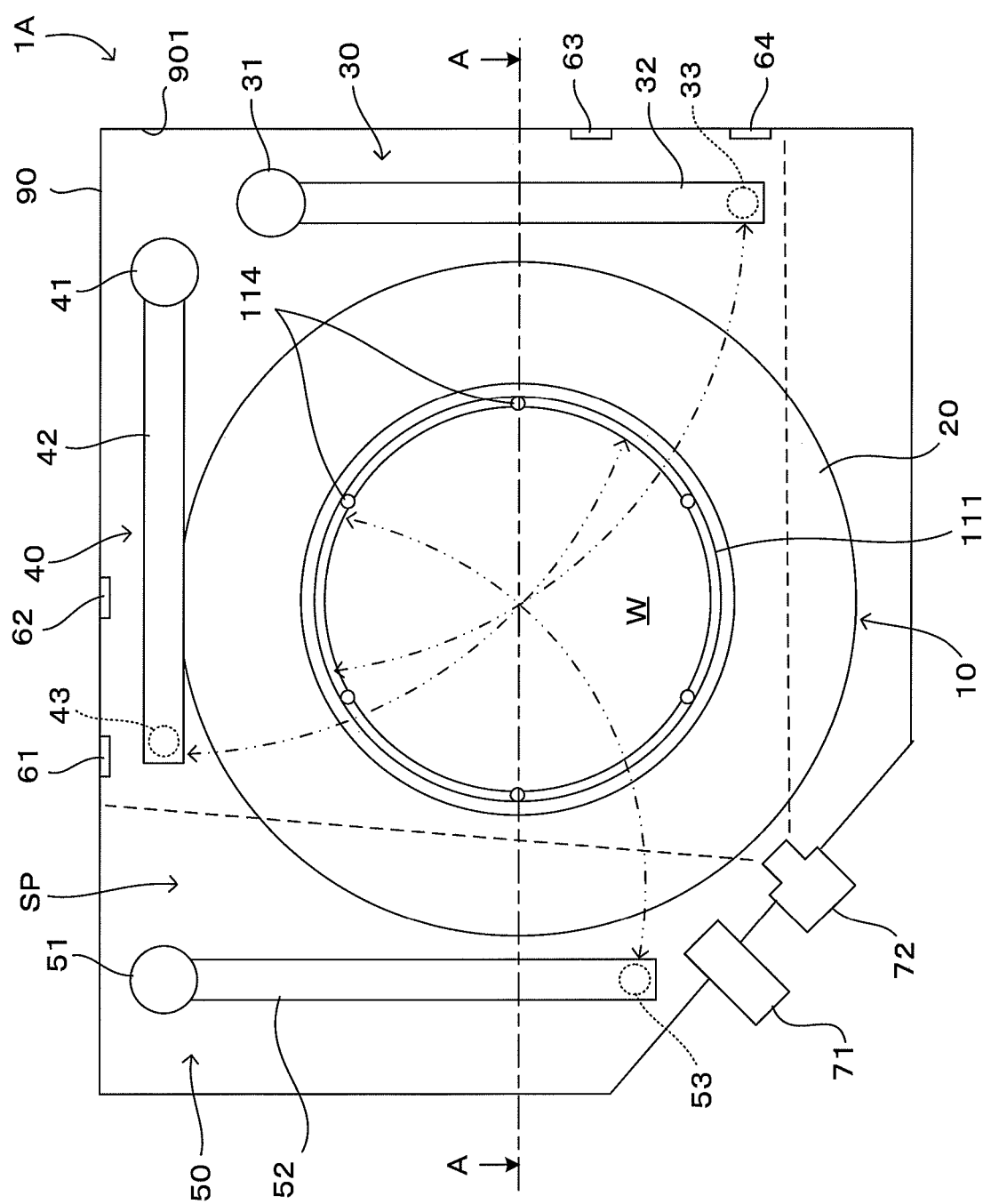
FIG. 2 is a plan view showing the structure of one substrate processing unit.

FIG. 2 is a plan view showing the structure of one substrate processing unit. FIG. 3 is a drawing showing the cross section of FIG. 2 taken along the arrow A-A and the structure of the controller of the substrate processing unit. The substrate processing unit 1A is a wet processing unit of the single wafer processing type for executing wet processing, such as cleaning and etching using a processing fluid, of a disk-shaped substrate W such as a semiconductor wafer. In the substrate processing unit 1A, a fan filter unit (FFU) 91 is disposed to a ceiling section of a chamber 90. The fan filter unit 91 comprises a fan 911 and a filter 912. External atmosphere which is admitted as the fan 911 operates is supplied into a processing space SP which is inside the chamber 90 via the filter 912. The substrate processing system 1 is used as it is installed inside a clean room, and the processing space SP continuously receives clean air all times.

A substrate holder 10 is disposed inside the processing space SP of the chamber 90. The substrate holder 10 is for rotating the substrate W while maintaining the substrate W in an approximate horizontal posture so that the one surface of the substrate W is directed toward above. The substrate holder 10 comprises a spin chuck 11 in which a disk-shaped spin base 111 whose outer diameter is slightly larger than the substrate W and a rotation support shaft 112 which elongates approximately along the vertical direction are integrated and linked with each other. The rotation support shaft 112 is linked with the rotation shaft of a chuck rotating mechanism 113 which includes a motor so that it is possible for the spin chuck 11 to rotate about the rotation shaft (the vertical axis) when driven by a chuck driver 85 of the controller 80. The rotation support shaft 112 and the chuck rotating mechanism 113 are housed inside a cylindrical casing 12. The spin base 111 is integrated and linked with the top end of the rotation support shaft 112 by a fastening component such as a screw, and the spin base 111 is supported by the rotation support shaft 112 approximately horizontally. Hence, as the chuck rotating mechanism 113 operates, the spin base 111 rotates about the vertical axis. The controller 80 controls the chuck rotating mechanism 113 via a chuck driver 85, which makes it possible to adjust the rotation speed of the spin base 111.

There are a plurality of chuck pins 114 for grabbing the substrate W at the peripheral edge which are disposed in the vicinity of the peripheral edge of the spin base 111. There may be three or more (six in this example) such chuck pins 114 for the purpose of securely holding the circular substrate W. The chuck pins are disposed at equal angular intervals along the peripheral edge of the spin base 111. Each chuck pin 114 is structured so as to be able to switch between the pressing state in which it presses the exterior peripheral edge surface of the substrate W and the released state in which it is off the exterior peripheral edge surface of the substrate W.

Each one of the chuck pins 114 is released when the substrate W is handed over to the spin base 111 but remains in the pressing state when the substrate W is rotated and subjected to predetermined processing. When in the pressing state, the chuck pins 114 can hold the substrate W at the peripheral edge of the substrate and keep the substrate W approximately horizontally over a predetermined gap from the spin base 111. Thus, the substrate W is supported with its top surface directed toward above and its bottom surface directed toward below. The chuck pins 114 are not limited to above structure but may be of one of various known structures. The mechanism for holding substrates is not limited to chuck pins but may instead be a vacuum chuck which sucks the substrate W at the back surface of the substrate and thereby holds the substrate.

Around the casing 12, a splash guard 20 is disposed which surrounds the substrate W which is held horizontally by the spin chuck 11 in such a manner that the splash guard 20 can move upward and downward along a direction of the rotation shaft of the spin chuck 11. The splash guard 20 has an approximately rotation symmetric shape with respect to the rotation shaft, and comprises a plurality of guards 21 (two guards in this example), which are each disposed concentric to the spin chuck 11 and receive a splashed processing fluid from the substrate W, and a fluid receiver 22 which receives the processing fluid flowing down from the guards 21. As a guard up-down mechanism not shown disposed to the controller 80 makes the guards 21 ascend or descend stepwise, it is possible to segregate and collect a processing fluid such as a chemical solution and a rinse solution splashed around from the rotating substrate W.

Around the splash guard 20, at least one fluid supplier is disposed which provides the substrate W with various types of processing fluids such as a chemical solution which may be an etching solution, a rinse solution, a solvent, pure water and DIW (deionized water). In this example, as shown in FIG. 2, there are three fluid dischargers 30, 40 and 50. The fluid discharger 30 comprises a revolving shaft 31, which can revolve about the vertical axis when driven by an arm driver 83 of the controller 80, an arm 32 extending horizontally from the revolving shaft 31, and a nozzle 33 which is attached as it is directed toward below to the tip end of the arm 32. As the arm driver 83 drives the revolving shaft 31, the arm 32 swings about the vertical axis, whereby the nozzle 33 reciprocally moves between a retracted position which is outward beyond the splash guard 20 (i.e., the position denoted by the solid line in FIG. 3) and a position above the center of rotation of the substrate W (i.e., the position denoted by the dotted line in FIG. 3) as shown by the two-dot chain line in FIG. 2. The nozzle 33, while staying above the substrate W, discharges a predetermined processing fluid supplied from a processing fluid supplier 84 of the controller 80 and accordingly supplies the processing fluid to the substrate W.

Similarly, the processing fluid discharger 40 comprises a revolving shaft 41 which is driven by the arm driver 83, an arm 42 linked with this revolving shaft 41, and a nozzle 43 which is attached to the tip end of the arm 42 and discharges the processing fluid fed from the processing fluid supplier 84. The processing fluid discharger 50 comprises a revolving shaft 51 which is driven by the arm driver 83, an arm 52 linked with this revolving shaft 51, and a nozzle 53 which is attached to the tip end of the arm 52 and discharges the processing fluid fed from the processing fluid supplier 84. The number of the processing fluid dischargers is not limited to this but may be increased or decreased as needed.

Note that chain double-dashed lines in FIG. 2 indicate movement trajectories of the respective nozzles 33, 43 and 53. As is understood from this, each nozzle 33, 43, 53 moves along an arc on a horizontal plane from the retracted position to a peripheral edge part of the substrate W on a side distant from the retracted position beyond the center of rotation of the substrate W. The processing fluid can be discharged from each nozzle both in a state where the nozzle is fixedly positioned above the substrate W and in a state where the nozzle is moving above the substrate W. In this way, various wet processes can be realized.

In a condition that the substrate W is rotating at a predetermined rotation speed as the spin chuck 11 rotates, the processing fluid dischargers 30, 40 and 50 supply the processing fluid to the substrate W while the nozzles 33, 43 and 53 become positioned above the substrate W one after another, thereby performing wet processing of the substrate W. Different processing fluids or the same processing fluid may be discharged at the nozzles 33, 43 and 53 in accordance with the purpose of processing. Alternatively, two or more types of processing fluids may be discharged from one nozzle. The processing fluid supplied to the vicinity of the center of rotation of the substrate W spreads outwardly due to centrifugal force which develops as the substrate W rotates, and eventually gets drained off toward the side from the peripheral edge of the substrate W. The processing fluid thus splashed by the substrate W is then received by the guards 21 of the splash guard 20 and collected by the fluid receiver 22.

The substrate processing apparatus 1A further comprises an illuminator 71 which illuminates inside the processing space SP and a camera 72 which is neighboring of the illuminator 71 and takes an image of the surface of inside the chamber 90. The illuminator 71 uses an LED lamp as a light source for instance, and provides illumination light into inside the interior of the processing space SP which is needed for taking an image with the camera 72. The camera 72 is disposed at a higher position as compared with the substrate W along the vertical direction, and its imaging direction (i.e., the direction of the optical axis of the imaging optical system) is set as a downwardly oblique direction toward the approximate center of rotation in the surface of the substrate W so as to take an image of the top surface of the substrate W. The entire surface of the substrate W held by the spin chuck 11 thus comes into inside the field of view of the camera 72. In horizontally, an area between the two dashed lines in FIG. 2 is included in the field of view of the camera 72.

Note that the illuminator 71 and the camera 72 may be disposed inside the chamber 90, or they may be disposed outside the chamber 90 so as to illuminate or take an image of the substrate W via a transparent window provided in the chamber 90. In terms of preventing the adhesion of the processing liquid and exposure to a processing atmosphere, these are preferably disposed outside the chamber 90.

Image data output from the camera 72 are fed to an image processor 86 of the controller 80. The image processor 86 then performs predetermined image processing of the image data such as a correction processing or a pattern matching processing described later. As described later in detail, in this embodiment, in accordance with images taken by the camera 72, how the nozzles 33, 43 and 53 are positioned and how the substrate W is held is determined. Further, the installment position of the camera 72 relative to the chamber 90 could get deviated from the appropriate position, which can be handled by the structure according to this embodiment.

For these purposes, alignment marks 61 through 64 which serve as position references are fixed at a plurality of positions which are within the field of view of the camera 72 and which are on an inner wall surface 901 of the chamber 90. The positions of the alignment marks 61 through 64 inside the chamber 90 have been determined in advance. The alignment marks 61 through 64 are so arranged that as illumination light irradiated from the illuminator 71 is reflected at the surfaces of the alignment marks 61 through 64, the reflected light impinges upon the camera 72. The alignment marks 61 through 64 contained within an image shot by the camera 72 are used as position references which are for assessment of the positions and the postures of the camera 72, the respective nozzles 33, 43 and 53 and the substrate W.

In addition to the above, the controller 80 of the substrate processing system 1 comprises a CPU 81, a memory 82 and a display 87. The CPU 81 executes a processing program set in advance and accordingly controls operations of the respective parts. The memory 82 stores the processing program executed by the CPU 81, data created during processing, etc. The display 87 informs a user as needed of a progress in processing, abnormality, etc. Each one of the substrate processing units 1A through 1D may have one such controller 80, or only one controller 80 may be disposed for the substrate processing system 1 for control of all substrate processing units 1A through 1D. Further, the CPU 81 may function as an image processor as well.

The operation of the substrate processing unit 1A having the structure above will now be described. The other substrate processing units 1B through 1D operate similarly although they will not be described. Through the indexer part 1E, the substrate processing unit 1A receives the substrate W which has been transported from outside and supplies various types of processing fluids while rotating the substrate W, thereby executing wet processing. A number of known techniques are available which use various types of processing fluids for wet processing, and any such technique may be used.

Figure 4:
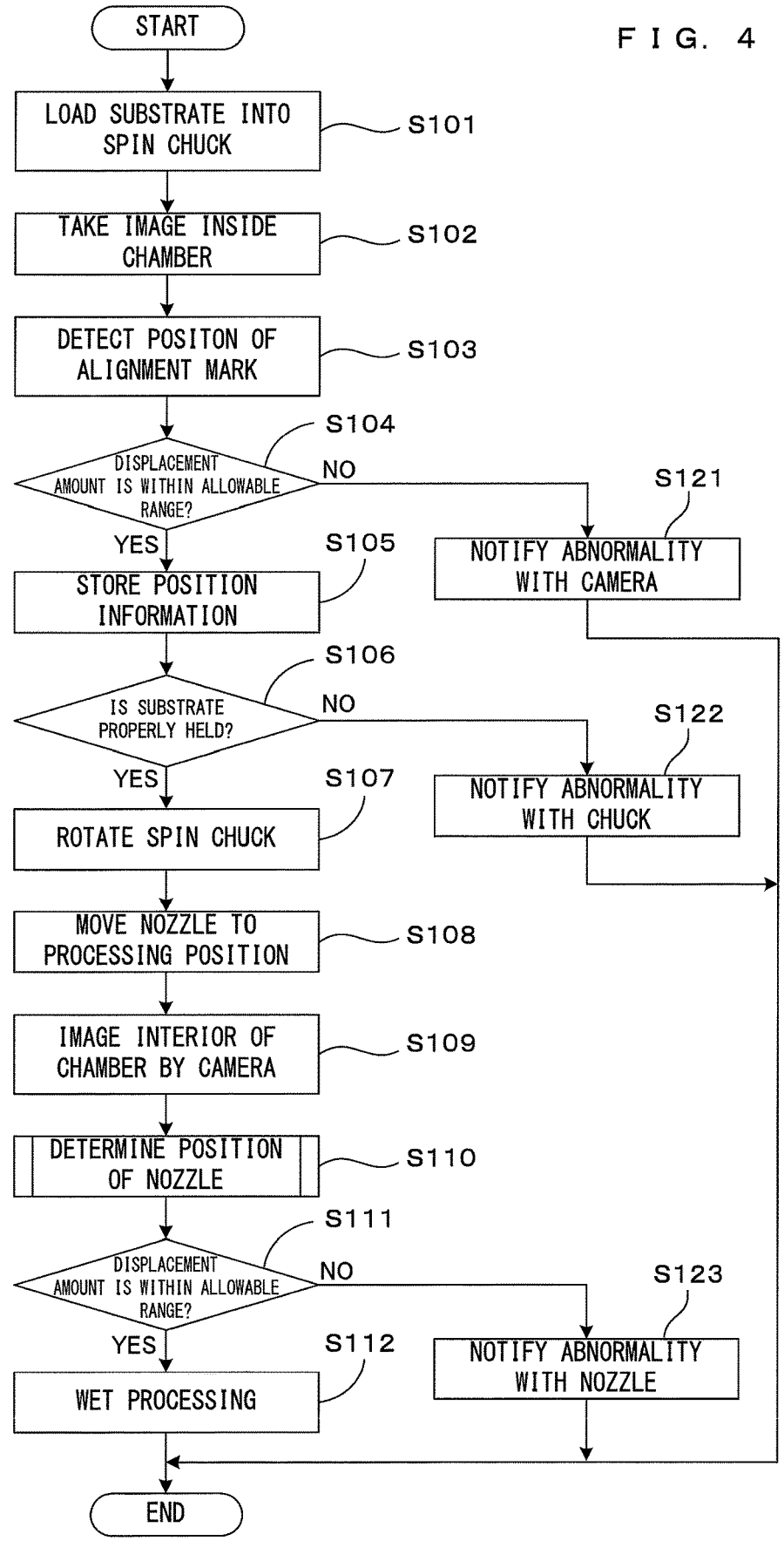
FIG. 4 is a flow chart showing the operation of the substrate processing unit.

FIG. 4 is a flow chart showing the operation of the substrate processing unit. This operation is realized as the CPU 81 executes the predetermined processing program. The substrate W is loaded into the substrate processing unit 1A and is then set to the spin chuck 11, more specifically, to the plurality of chuck pins 114 which are disposed to the peripheral edge of the spin base 111 (Step S101). During loading of the substrate W, the chuck pins 114 disposed to the spin base 111 are in the released state but switch to the pressing state after the substrate W is set at the chuck pins 114 and accordingly hold the substrate W. In this state, the camera 72 takes an image of inside of the chamber 90 (Step S102).

Figure 5:
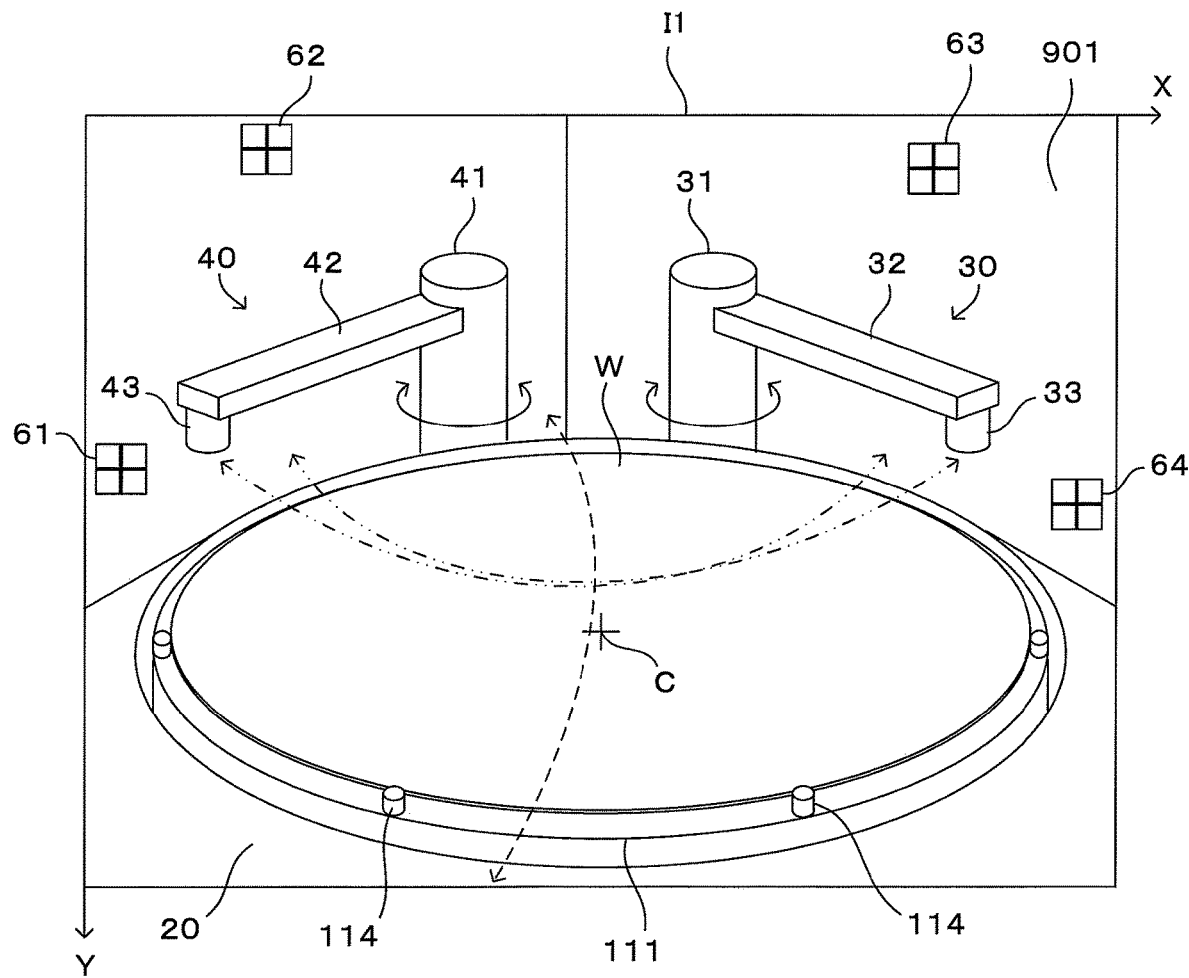
FIG. 5 is a schematic drawing showing an example of an image which is obtained by imaging inside the chamber.

FIG. 5 is a schematic drawing showing an example of an image which is obtained by imaging inside the chamber. An image I1 shot by the camera 72 which is installed at such a position which looks down on the substrate W contains the substrate W which is mounted on the spin base 111 and the respective members such as the splash guard 20 which surrounds the substrate W, fluid dischargers 30 and 40 and the alignment marks 61 through 64. The assumption is that the camera 72 is attached at an appropriate position relative to the chamber 90.

In image examples in FIG. 5 and later figures, the upper and left corners of the images are regarded as origins and the horizontal direction and the vertical direction of the images are defined as X-direction and Y-direction respectively. Each position in one image may be specified by coordinate of the X-Y image plain which is represented by the X-coordinate extending rightward from the origin and the Y-coordinate extending downward from the origin.

The alignment marks 61 through 64 are arranged at dispersed positions on the chamber inner wall 901 which are within the field of view of the camera 72 and which are not blocked by the substrate W or the respective members disposed inside the chamber 90 such as the fluid dischargers 30 and 40. Specifically, the alignment marks 61 and 64 are so arranged that they are captured by the camera at such positions which are around the center of the image I1 along the perpendicular direction and which are close to the far-left and the far-right along the horizontal direction. Meanwhile, the alignment marks 62 and 63 are arranged such that they are apart from each other horizontally close to the top edge of the image I1. As the alignment marks 61 through 64 are dispersed in this manner, it is possible to enhance the accuracy during detection of deviation of the camera 72 which will be described later.

Although the alignment marks 61 through 64 may be of any desired material and may have any desired shapes, it is desirable that the camera 72 can shoot them under illumination light from the illuminator 71 in sufficient contrast for position detection. More preferably, it is desirable that the shapes of the alignment marks can be detected at a high accuracy from an image which was shot. The alignment marks 61 through 64 in this substrate processing unit 1A are rectangle plate members which bear the mark which looks like "+" as shown in FIG. 5. For instance, plate members of stainless steel on which the mark above is engraved or painted may be used. Provision of the alignment marks which have these characteristics makes it possible to highly accurately detect not only the positions of the alignment marks but rotation, the sizes and the like within the image as well.

In the event that the direction in which the illumination light impinges and the direction of the optical axis of the camera 72 generally match with each other as in the case of the unit 1A in which the camera 72 and the illuminator 71 are disposed in the vicinity of each other, it is preferable that at least one of the plate members and the marks is formed by a retroreflective material. This secures that the reflected light from the alignment marks impinges upon the camera 72 without fail, thereby making it possible to shoot high-contrast images of the alignment marks using large light quantity. In consequence, the accuracy for detecting the positions of the alignment marks is further increased.

As indicated by the double chain line in FIG. 5, the nozzles 33 and 43 which discharge the processing fluid are capable of moving horizontally. As the processing fluid is discharged in a condition that these nozzles are located at predetermined positions above the substrate W, the substrate W is processed. The nozzle 53 (FIG. 2) not shown in FIG. 5 as well, as a trajectory thereof is shown in broken line in FIG. 5, when moving toward above the substrate W, comes into the field of view of the camera 72. Using an image shot with the camera 72, it is possible to determine whether the positions of the nozzles during execution of the processing are appropriate. In this manner, it is possible to avoid inappropriate processing by any nozzle which is at an inappropriate position and to stably process the substrate W.

However, it is possible that the camera 72 per se could be deviated relative to the chamber 90 because of contact with any member during loading or unloading of the substrate W, vibration during the processing or the like for instance. It is therefore necessary to prevent misdetection of the position of any nozzle due to such deviation. In this embodiment, the alignment marks 61 through 64 are fixed to the inner wall surface 901 of the chamber 90 and the position of each alignment mark 61 through 64 inside the chamber 90 remains unchanged. Thus, the position of each alignment mark 61 through 64 is precisely known in advance for an image imaged by the camera 72 mounted at a proper position with respect to the chamber 90.

From this, the presence or absence of a positional displacement of the camera 72 can be determined based on whether or not the alignment marks 61 through 64 are at predetermined positions in the imaged image. A plurality of the alignment marks 61 through 64 are arranged to appear at dispersed positions in the image. Thus, the presence or absence, the size, the direction and the like of the positional displacement of the camera 72 can be detected from these position detection results in the image.

Referring back to FIG. 4, the flow chart is further described. Using the image inside the chamber 90 imaged in Step S102, the positions of the alignment marks 61 through 64 in the image are detected based on the above principle (Step S103). A positional displacement amount of the camera 72 is evaluated based on that detection result. If the positional displacement amount is within an allowable range determined in advance (YES in Step S104), processings in and after Step S105 are performed. On the other hand, if the positional displacement amount is beyond the allowable range (NO in Step S104), the occurrence of a camera abnormality is notified to the user, for example, by displaying a predetermined error message on the display 87 (Step S121) and the process is finished.

If the camera 72 is largely shifted for a certain cause, any one of the alignment marks may be deviated from an imaging visual field. In such a case, the position of this alignment mark cannot be detected. It is clear that this state causes a problem in the subsequent detection and, hence, this case may be also regarded as a camera abnormality.

In this substrate processing unit 1A, a positional displacement of the camera 72 is detected as described above. If there is a small positional displacement as a result of the detection, the process is continued on the assumption that the positional displacement is corrected by an image processing. On the other hand, if there is a large positional displacement unavoidably resulting in a reduction of detection accuracy even if a correction is made, the process is stopped. In this way, a certain positional displacement of the camera 72 is allowed and the process is continued. It possibly causes reductions in the throughput of the process and an operating rate of the system that the entire process is stopped due to the positional displacement of the camera 72 not directly contributing to the substrate processing. In the above way, a probability of causing such a situation can be reduced. On the other hand, by stopping the process, when there is a large positional displacement, it is prevented that an improper process is performed on the substrate.

If the obtained positional displacement amount of the camera 72 is within the allowable range, information indicating the positional displacement amount at that time is stored in the memory 82 (Step S105). This information is used as correction information in detecting the position of the nozzle later. Note that the information stored in the memory 82 may be position information of each alignment mark 61 through 64 or may be information on the positional displacement amount of the camera 72 calculated from those pieces of information. Any piece of information reflects the position information of each alignment mark detected from the image and indicates the positional displacement amount of the camera 72.

Subsequently, whether or not the substrate W is properly held by the spin chuck 11 is determined (Step S106). If the substrate W is placed while being inclined with respect to the spin base 111 or deviated from the rotation center, a problem that the substrate W falls or abnormally vibrates during the rotation of the spin chuck 11 possibly occurs. To avoid these, the holding state of the substrate W is determined before the spin chuck 11 is rotated. The holding state can be determined, for example, based on the posture of the substrate W detected from the image.

A known pattern matching technique can be used for the detection of the substrate W in the image. Besides, a known ellipse detection algorithm can be used as a method capable of detection in a shorter time. Specifically, ellipses of a size corresponding to a diameter of the substrate W are searched by an appropriate ellipse detection algorithm, using a coordinate range in an area having a high probability of being taken up by the substrate W in the image as a search area. As a result, center coordinates and sizes in X and Y directions of the ellipse matching the condition are obtained.

If these numerical values substantially match numerical values in an ideal holding state, it can be determined that the substrate W is properly held. On the other hand, if the numerical values largely deviate, it can be determined that the substrate W is improperly held.

Note that the posture of the substrate W detected from the image is the addition of the posture of the substrate W in the processing space SP and the influence of the positional displacement of the camera 72 described above. Thus, the posture of the substrate W obtained by the search is compared with the ideal state after the influence by the positional displacement of the camera 72 is subtracted based on the position information of the alignment marks obtained earlier, and the holding state is determined from that result.

Referring back to FIG. 4 again, the flow chart is further described. If it is determined that the substrate W is improperly held by the spin chuck 11 (NO in Step S106), the occurrence of a chuck abnormality is notified to the user, for example, by displaying a predetermined error message on the display 87 (Step S122) and the process is finished. In this way, the fall and abnormal vibration of the substrate W due to the rotation of the spin chuck 11 in the improper holding state can be avoided.

If the holding state is proper (YES in Step S106), the spin chuck 11 is rotated at a predetermined rotation speed for the substrate processing (Step S107). Subsequently, the arm driver 83 is activated to position any one of the plurality of nozzles at a predetermined processing position facing the substrate W (Step S108). Although the process using the nozzle 43 is described below, a similar operation is performed also in the case of using the other nozzles 33, 53. Further, the plurality of nozzles may be simultaneously used for the process. When the nozzle 43 is positioned at the processing position, the camera 72 images the interior of the chamber 90 (Step S109) and the position of the nozzle 43 is determined based on that image (Steps S110, S111).

Figure 6:
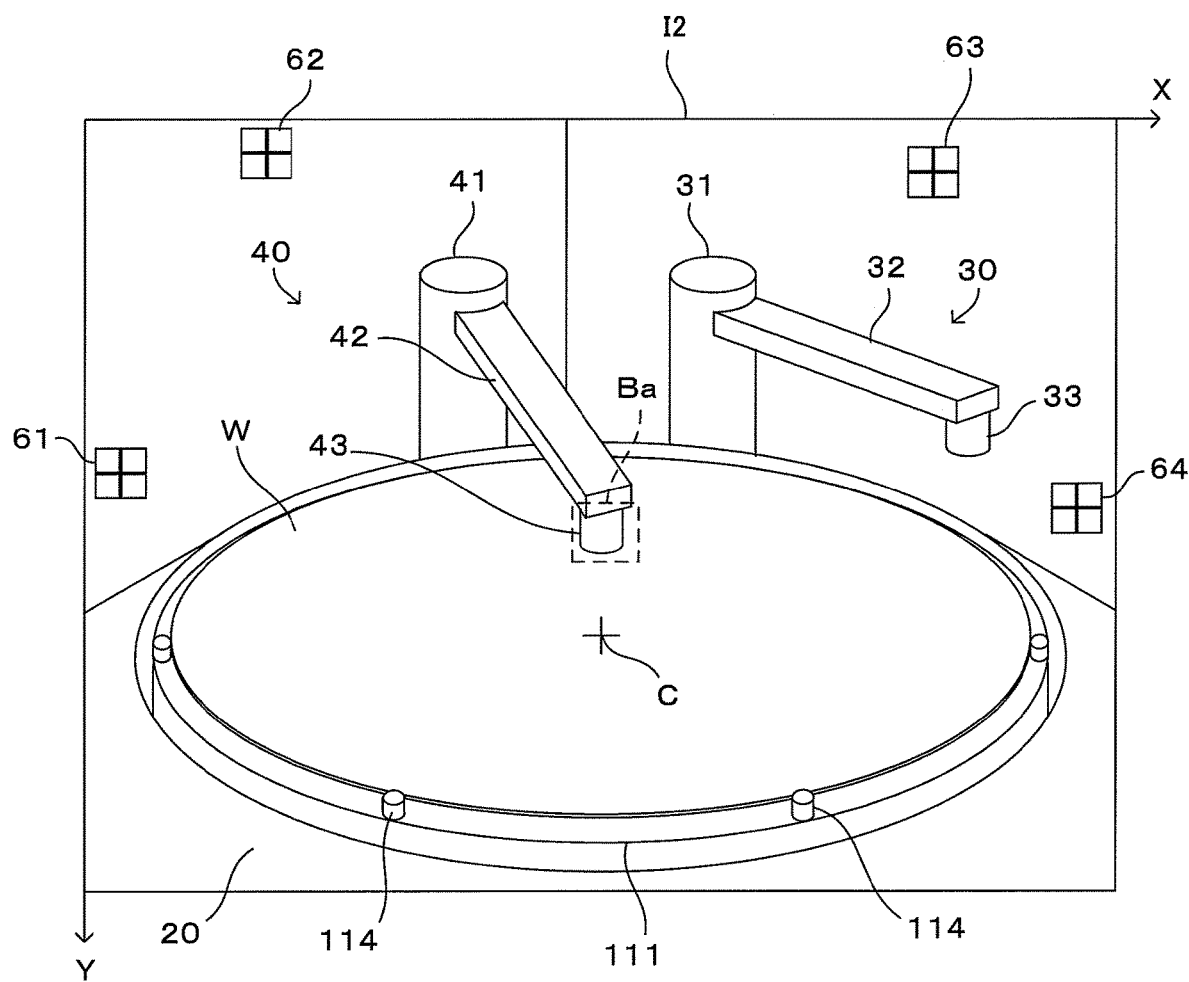
FIG. 6 is a drawing showing an example of an image obtained by imaging the nozzle.

FIG. 6 is a drawing showing an example of an image obtained by imaging the nozzle. More specifically, an example of an image 12 obtained by imaging the interior of the chamber 90 with the nozzle 43 positioned at the processing position above the substrate W is shown in FIG. 6. The controller 80 can learn the processing position of the nozzle 43 by a prior teaching operation. Here, it is assumed that a position above the rotation center C of the substrate W is set as the processing position of the nozzle 43.

A reference matching pattern and box information are obtained from an image imaged in advance in a state where there is no positional displacement of the camera 72 or the positional displacement is properly corrected and the nozzle 43 is correctly positioned at the processing position by the prior teaching operation. Specifically, an image pattern of an area Ba taken up by the nozzle 43 in the image is obtained as the reference matching pattern and coordinate information of the area Ba is obtained as the box information used for the detection of the nozzle position when the process is performed on the substrate. These pieces of information are stored in the memory 82 in advance. Every time the process is performed on the substrate, the position of the nozzle 43 is detected from the image 12 imaged in Step S109 and the positional displacement amount of the nozzle 43 is calculated by comparing the detected position with the box information (Step S110). Based on that result, whether or not the position of the nozzle 43 is proper is determined (Step S111).

Figure 7:
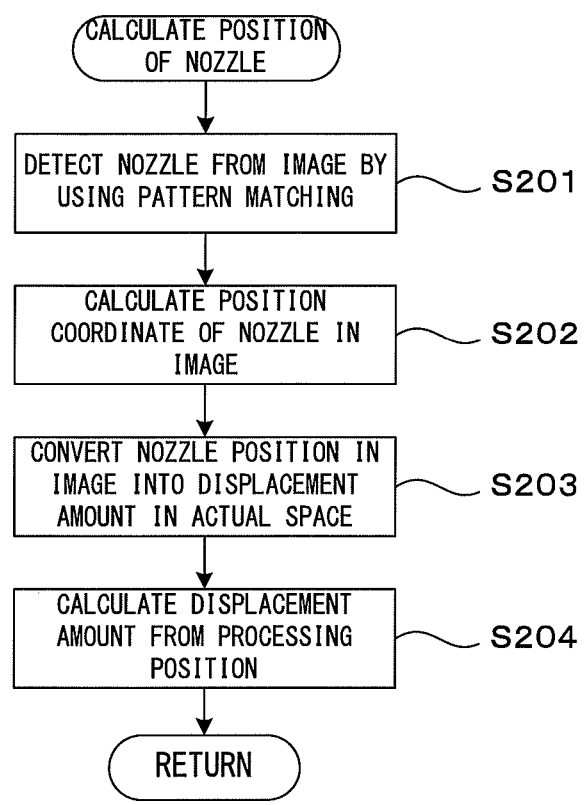
FIG. 7 is a flow chart showing a nozzle position calculation process.

FIG. 7 is a flow chart showing a nozzle position calculation process. This flow chart more specifically explains the processing contents of Step S110 of FIG. 4. In this process, the nozzle 43 is first detected from the image 12 using the pattern matching technique (Step S201). The following two methods are, for example, considered as a method for detecting the nozzle 43 from the image 12 by the pattern matching technique. The first method is a method for searching the area Ba having image contents matching the reference matching pattern stored in the memory 82 in the image 12. Further, the second method is a method for comparing image contents of the area Ba specified by the box information stored in the memory 82 out of the image 12 with those of the reference matching pattern and evaluating a matching score between the both. Either one of the methods may be used and a method other than those may also be used.

When the area Ba corresponding to the nozzle 43 is detected in the image 12, the position coordinates thereof are obtained and stored in the memory 82 (Step S202). Typical coordinates indicating the position of the area Ba such as the coordinates of a left-upper corner of the area Ba or those of a centroid of the area Ba can be used as the position coordinates of the nozzle 43. Note that if there is a positional displacement of the camera 72, the coordinates are appropriately corrected to compensate for this positional displacement in processings of Steps S201 and S202.

Subsequently, the position of the nozzle 43 obtained in the image 12 is converted into a displacement amount of the nozzle 43 from the reference position in the actual space inside the chamber 90 by a conversion method to be described later (Step S203). A particular position inside the chamber 90 is specified as the reference position in advance. For example, the processing position can be used as the reference position. However, if a positional relationship with the processing position as a target position of the nozzle 43 is clear, the reference position may be different from the processing position. On the other hand, necessary information is the positional displacement amount of the nozzle 43 from the designated processing position in the actual space. Therefore, the positional displacement amount from the processing position of the nozzle 43 is calculated based on the positional relationship of the reference position and the processing position known in advance if these positions are different (Step S204).

As just described, in this embodiment, how much the positioned nozzle is deviated from the reference position is evaluated by obtaining the displacement amount of the nozzle in the image 12 and converting the obtained displacement amount into the displacement amount in the actual space. The positional displacement amount of the nozzle is, for example, represented by a pixel number in the image 12, whereas the positional displacement amount in the actual space has a length dimension. Thus, in principle, the displacement amount in the actual space can be calculated by multiplying the displacement amount (pixel number) in the image by a length per pixel if a correspondence relationship between one pixel in the image and a length in the actual space is known.

However, the displacement amount per pixel is not uniform in the image and differs depending on a distance between a camera and an object to be imaged. Particularly, since distances to the nozzles 33, 43 and 53 as objects to be imaged are relatively short and these nozzles move in wide ranges, an angle of view of the camera 72 need to be wide to keep these within an imaging visual field. Thus, the displacement amount per pixel largely varies depending on the distances of the nozzles 33, 43 and 53 from the camera 72.

Figure 8:
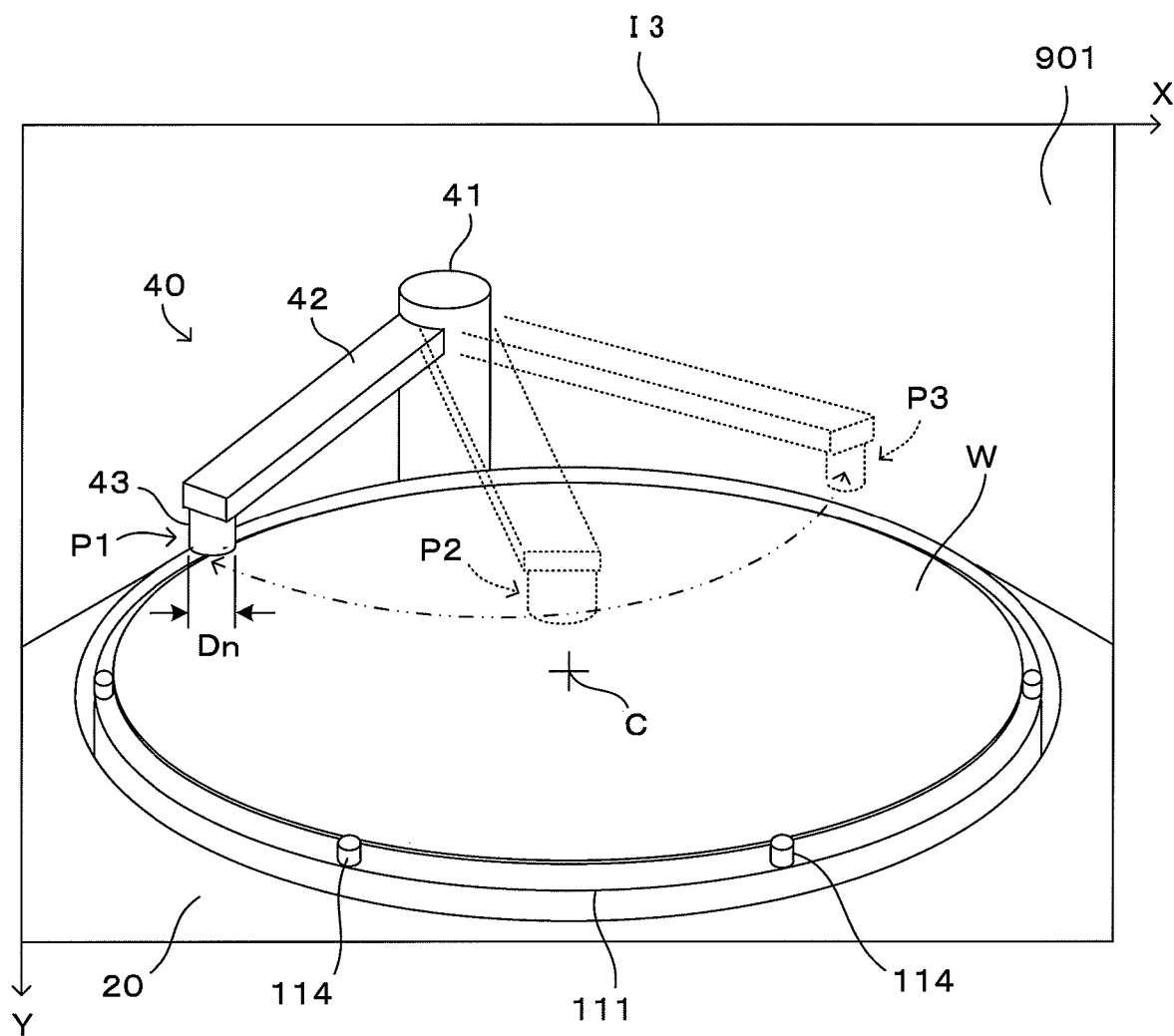
FIG. 8 is a diagram showing an example of a nozzle size variation at nozzle positions.

FIG. 8 is a diagram showing an example of a nozzle size variation at nozzle positions. Note that the configuration not directly related to explanation is not shown in FIG. 8 to make the figure easily viewable. Among when the nozzle 43 is at a position P1 above the peripheral edge part of the substrate W on a side near the retracted position, when the nozzle 43 is at a processing position P2 above the center of rotation C of the substrate W and when the nozzle 43 is at a position P3 above the peripheral edge part of the substrate W on the side distant from the retracted position beyond the processing position, the apparent size of the nozzle 43 in an image 13 largely changes due to differences in distance from the camera 72. Thus, a diameter Dn of the nozzle 43 grasped from the image differs depending on the nozzle position. Specifically, when a width of an area taken up by the nozzle 43 in the image 13 is expressed by a pixel number, this pixel number differs depending on the nozzle position. Of course, the size of the nozzle doesn't change in the actual space.

Similarly to this, the displacement amount of the nozzle appearing in the image differs depending on the nozzle position. Specifically, even if the displacement amount of the nozzle 43 in the actual space is the same, a large displacement appears in the image at a position where the nozzle 43 appears to be relatively large in the image and, conversely, a displacement appearing in the image is also small at a position where the nozzle 43 appears to be relatively small in the image. Conversely speaking, the displacement amount in the actual space equivalent to a displacement of one pixel in the image is larger when the nozzle 43 is distant from the camera 72 and appears to be relatively small in the image than when the nozzle 43 is close to the camera 72 and appears to be relatively large in the image.

If the displacement amount per pixel is changed in accordance with a change of the size of the nozzle 43 or the like appearing in the image in converting the displacement amount in the image into the displacement amount in the actual space, the problem as described above can be dealt with and the displacement amount in the actual space can be accurately obtained. Specifically, the coefficient by which the displacement amount expressed by the pixel number in the image is multiplied may be set according to the size of the nozzle in the image. The coefficient is equivalent to the displacement amount in the actual space corresponding to the displacement amount of one pixel in the image. For this purpose, the size of the nozzle appearing in the imaged image is obtained. In this embodiment, a diameter of the cylindrical nozzle 43 is obtained.

Figure 9A:
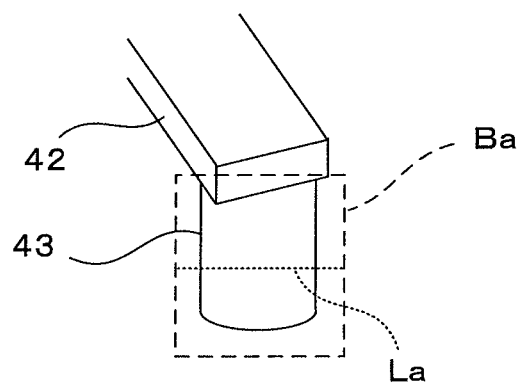
FIG. 9A is a diagram showing an example of a method for obtaining a nozzle diameter.
Figure 9B:
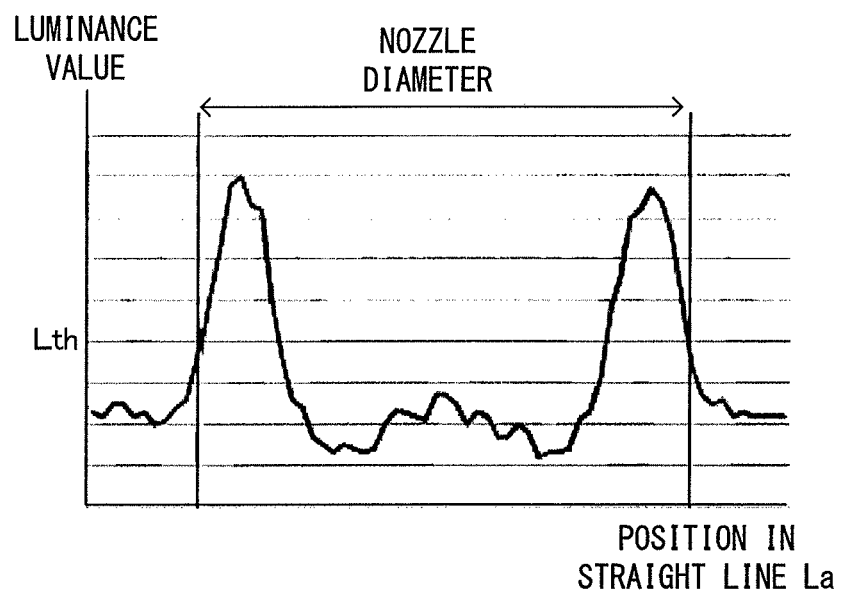
FIG. 9B is a graph showing an example of a method for obtaining a nozzle diameter.

FIGS. 9A and 9B are a diagram and a graph showing an example of a method for obtaining a nozzle diameter. As shown in FIG. 9A, a horizontal straight line La is set in an area Ba corresponding to the nozzle 43 detected in the image 12 by pattern matching. The straight line La is set to cross the nozzle 43 included in the area Ba. Then, a luminance value of each pixel located on this straight line La is obtained. As shown in FIG. 9B, by detecting notable luminance values appearing in parts corresponding to both side end surfaces of the nozzle 43, a distance between the both side end surfaces of the nozzle, i.e. a nozzle diameter is obtained. For example, an appropriate threshold value Lth is set for the luminance values, positions where the luminance value is larger than the threshold value Lth are regarded as edge positions and the nozzle diameter can be expressed by the number of pixels included between two edge positions.

The nozzle diameter at this time can be expressed by the number of the pixels taking up a range corresponding to a surface (side surface) of the nozzle 43 on the straight line La. Since the diameter of the nozzle 43 is known in advance, a length in the actual space equivalent to one pixel in the image can be obtained by dividing the value of the diameter by the number of pixels between the edges. The length per pixel obtained in this way serves as a conversion coefficient in converting the displacement amount in the image expressed by the pixel number into the displacement amount in the actual space.

If a nozzle tip part has a cylindrical shape, the nozzle size can be specified by the nozzle diameter without depending on the position of the nozzle tip part. In a configuration in which the nozzle is moved and positioned by the swingable arm as in this embodiment, the orientation of the nozzle with respect to the camera 72 varies depending on the position of the nozzle. If the nozzle tip part has a cylindrical shape, there is no influence caused by orientation differences.

Note that the shape of the nozzle is not limited to the cylindrical shape. Also with a nozzle having an arbitrary shape, the size detection of the nozzle can be facilitated, for example, by providing a marker having dimensions determined in advance, scales at regular intervals or the like if necessary.

Other methods for obtaining the nozzle size include a method using information obtained by pattern matching. Specifically, in pattern matching, the area Ba corresponding to a reference matching pattern prepared in advance is detected from the image 12 to be processed. At this time, a higher matching score may be obtained by enlarging or reducing the reference matching pattern. This means that an object to be imaged (nozzle in this case) corresponding to the reference matching pattern appears in the image 12 in a size larger or smaller than an image from which the reference matching pattern was obtained.

In other words, an enlargement rate or reduction rate of the reference matching pattern applied in pattern matching for the image 12 represents a relative nozzle size on the basis of the nozzle size indicated by the reference matching pattern. Thus, if only the nozzle size in the reference matching pattern is obtained in advance, the nozzle size in an arbitrary image can be obtained by multiplying the obtained value by the enlargement rate or reduction rate of the reference matching pattern applied in pattern matching. Since information for estimating the nozzle size is obtained when the nozzle position is specified by pattern matching in this method, an operation for calculating the nozzle size anew is not necessary.

Note that, in terms of setting the conversion coefficient of the displacement amount from the image into the actual space, it is sufficient to obtain the length in the actual space equivalent to one pixel of the image. Thus, the conversion coefficient corresponding to an arbitrary nozzle position can be directly obtained even without obtaining the nozzle size by multiplying the conversion coefficient at the position where the reference matching pattern was obtained by the above enlargement rate or reduction rate.

As just described, in this embodiment, the conversion coefficient for converting the displacement amount in the image expressed by the pixel number into the displacement amount in the actual space is changed and set according to the size of the nozzle 43 or the like in the image. By doing so, the positional displacement amount of the nozzle 43 or the like from the processing position in the actual space can be accurately obtained in spite of a change of the displacement amount per pixel caused due to a difference in distance from the camera 72.

Referring back to FIG. 4, the flow chart is further described. It is determined whether or not the positional displacement amount of the nozzle 43 from the processing position obtained as described above is within an allowable range determined in advance (Step S111). If within the allowable range (YES in Step S111), the wet process is performed by supplying the predetermined processing liquid from the nozzle 43 to the substrate W (Step S112). If the positional displacement amount of the nozzle 43 is beyond the allowable range (NO in Step S111), the occurrence of a nozzle abnormality is notified to the user, for example, by displaying a predetermined error message on the display 87 (Step S123) and the process is finished. In this way, it can be avoided that the processing liquid is supplied from the nozzle 43 at an improper position to lead to a failure in processing result. Further, since it is guaranteed that the process is performed by the nozzle 43 positioned at a proper position, a good processing result can be stably obtained.

Next, a specific method for reflecting the size of the nozzle with respect to the image on the conversion coefficient in converting the displacement amount in the image into the displacement amount in the actual space is described. Following two methods are, roughly, thought as this method. The first method is a method for obtaining the conversion coefficient of the displacement amount from the image into the actual space for each type of the nozzle and each processing position in advance. The second method is a method for detecting the nozzle size in real time and setting the conversion coefficient during the execution of the nozzle position calculation process shown in FIG. 7.

The first method is more specifically described. The trajectory of each nozzle 33, 43, 53 moving by a swinging movement of the arm 32, 42, 52 is determined in advance. One or more positions on the trajectory are set as the processing positions and any one of the nozzles is positioned at one processing position when the wet process for the substrate W is performed. At this time, for the purpose of confirming whether or not the nozzle is properly positioned at the processing position, Step S110 of FIG. 4, i.e. the nozzle position calculation process shown in FIG. 7 is performed.

At the processing position and in a range near the processing position, the displacement amount in the actual space equivalent to one pixel of the image can be practically regarded to be substantially constant. Thus, the conversion coefficient near one processing position can be obtained beforehand for each processing position of each nozzle. By doing so, the positional displacement of the nozzle can be determined by applying the conversion coefficient set in advance in actually processing the substrate W, and the processing can be simplified.

Figure 10:
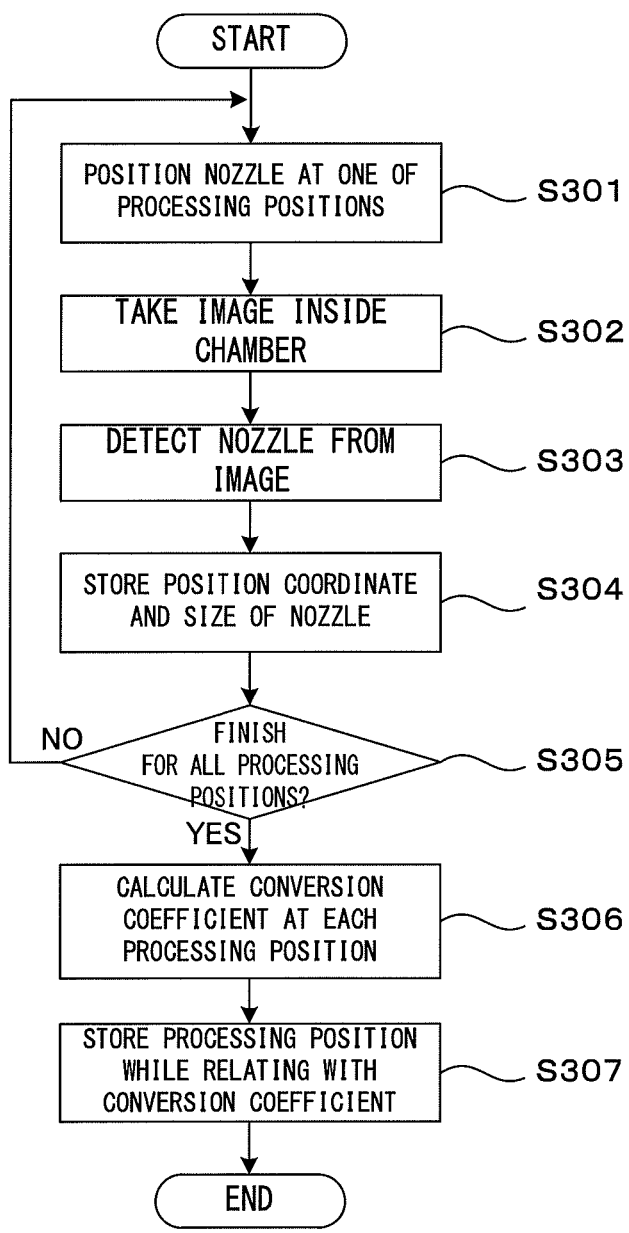
FIG. 10 is a flow chart showing a process of setting the conversion coefficient beforehand.

FIG. 10 is a flow chart showing a process of setting the conversion coefficient beforehand. Although the process for the nozzle 43 is described here, a similar process may be performed also for the other nozzles 33, 53. Firstly, the arm driver 83 rotates the arm 42 by a predetermined amount, whereby the nozzle 43 is positioned at one processing position (Step S301). In this state, the inside of the chamber 90 is imaged by the camera 72 (Step S302), and the nozzle 43 is detected from an image by the image processor 86 (Step S303). The position coordinates and size (diameter) of the nozzle 43 are calculated and stored in the memory 82 (Step S304). Specific methods for the position detection and size detection of the nozzle are described above. Imaging and the detection of the position and size of the nozzle are performed while the processing positions are successively switched until the above process is finished for all the processing positions (Step S305).

Since the diameter of the nozzle 43 is known, the conversion coefficient from the image into the actual space near the processing position can be obtained by dividing an actual diameter by the nozzle diameter detected in the image corresponding to one processing position. By performing this for each processing position (Step S306), the conversion coefficients corresponding to all the processing positions are obtained. The obtained conversion coefficients and the processing positions are related and stored, for example, in a table format in the memory 82 (Step S307).

When the displacement amount of the nozzle 43 is obtained in the actual process shown in FIGS. 4 and 7, the conversion coefficient corresponding to the processing position is read from the memory 82. The displacement amount of the nozzle 43 in the actual space is calculated by multiplying a distance between the processing position and the detected nozzle position in the image by the conversion coefficient. Since a relationship between the conversion coefficient determined according to the nozzle size in the image and the processing position is determined in advance, the nozzle size needs not be calculated in calculating the displacement amount of the nozzle.

The calculation process of the conversion coefficient described above is performed before the substrate W is processed if necessary such as when a component inside the chamber 90 is exchanged, when a new component is mounted, during a new teaching operation and during a regular maintenance operation and the like besides before the shipment of the apparatus.

Next, the second method for reflecting the size of the nozzle in the image on the conversion coefficient is described. In this method, the position and size of the nozzle 43 are detected from the image 12 imaged in the process shown in FIG. 4, and the conversion coefficient is dynamically set based on that result. The nozzle size is obtained in the aforementioned way. For example, the method shown in FIG. 9 and the method utilizing the enlargement rate or reduction rate of the reference matching pattern in pattern matching can be applied.

Only the conversion coefficient corresponding to the nozzle position (e.g. processing position above the center of rotation C of the substrate W) when the reference matching pattern was obtained is set in advance as a reference conversion coefficient. Then, by scaling the reference conversion coefficient according to the nozzle size detected in an arbitrary image, the conversion coefficient corresponding to the nozzle position in this image is determined. For example, the conversion coefficient of the displacement amount from the image into the actual space can be properly obtained according to the nozzle size by multiplying the reference conversion coefficient by an inverse of the enlargement rate or reduction rate of the reference matching pattern applied in pattern matching.

According to this method, the conversion coefficient needs not be obtained at each position beforehand. Thus, even if a processing position is, for example, added ex post facto, the positional displacement amount of the nozzle with respect to this processing position can be properly evaluated without any particular preparation.

Note that a length obtained by multiplying the distance between the nozzle position and the processing position in the image by the conversion coefficient determined according to the nozzle size is obtained as the positional displacement amount of the nozzle in the actual space here. It is then determined whether or not the obtained positional displacement amount is within the allowable range. However, for the purpose of determining whether or not the positional displacement amount of the nozzle in the actual space is within the allowable range, the comparison of a value obtained by dividing the allowable positional displacement amount by the conversion coefficient and the positional displacement amount detected in the image is technically equivalent.

Next, another method for calculating the positional displacement amount from the processing position in the actual space based on the position of the nozzle detected in the image is described. In the above methods, the displacement amount in the actual space equivalent to one pixel in the image is expressed by the conversion coefficient set according to the size of the nozzle detected in the image. Then, the displacement amount of the nozzle in the actual space is estimated by multiplying the positional displacement amount from the processing position detected in the image by the conversion coefficient.

On the other hand, in the method described next, a correspondence relationship of the nozzle position in the image and the position in the actual space is obtained in advance for each position on an arcuate nozzle movement path. The nozzle position detected in the image is converted into a nozzle position in the actual space based on the correspondence relationship, whereby the positional displacement amount from the processing position is obtained. How to obtain a conversion formula for this is described below. Note that for the purpose of determining whether or not the nozzle is properly positioned, the coordinate position of the nozzle 43 in the actual space needs not be specified and it is sufficient to accurately obtain the positional displacement amount from the reference position.

Although how to obtain a conversion formula corresponding to one nozzle 43 is described here, a similar process is possible also for the other nozzles 33, 53. Further, the configuration of the apparatus and basic operations of each unit are not different at all from those of the embodiment described above except the conversion method for obtaining the displacement amount in the actual space from the nozzle position detected in the image.

As shown in FIG. 2 and FIG. 5, the arm 42 rotates about the rotary shaft 41, whereby the nozzle 43 moves along an arc including the processing position above the rotation center of the substrate W in the horizontal direction. On the other hand, the image 12 is imaged by the camera 72 arranged to look down upon a movement path of the nozzle 43 obliquely from an upper side. Thus, a trajectory of the nozzle 43 in the images 12 when the nozzle 43 moves along that movement path is complicated. Further, particularly near an end part of the image, the image may be distorted due to lens characteristics of the camera 72. By these causes, a moving direction and a movement amount of the image of the nozzle 43 generally have a nonlinear relationship between the movement in the actual space and the movement in the images 12.

Figure 11A:
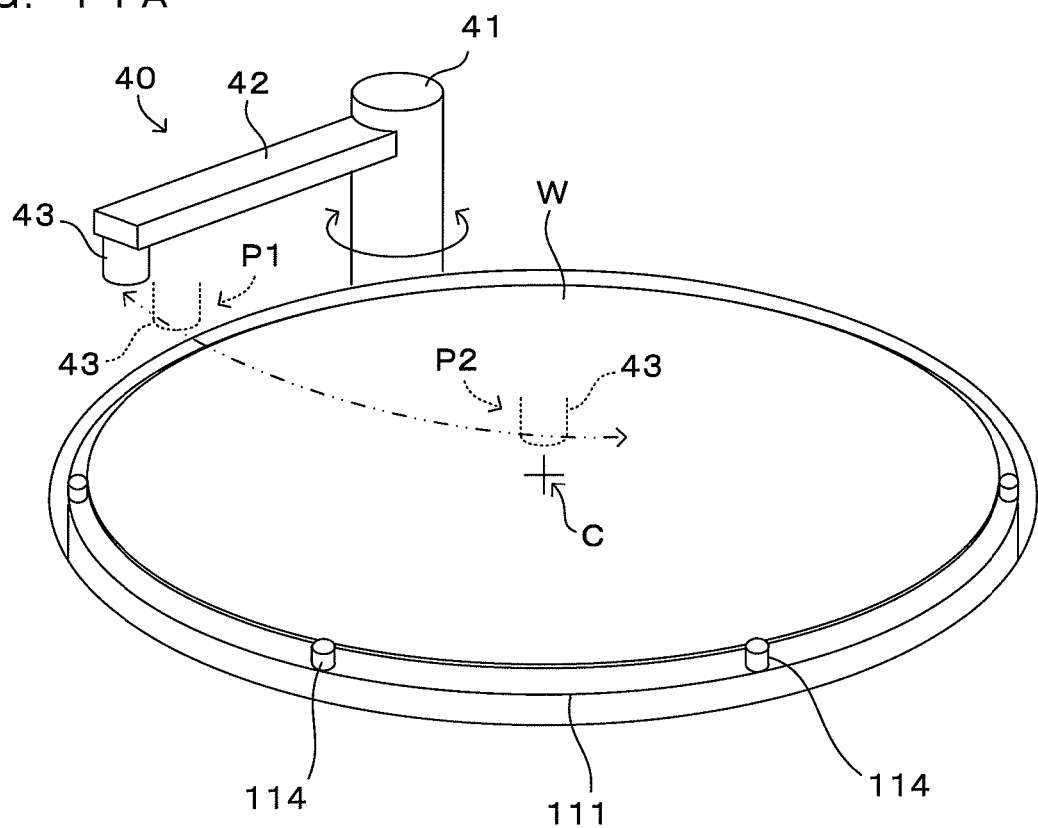
FIGS. 11A and 11B are diagrams showing some processing positions of the nozzle.
Figure 11B:
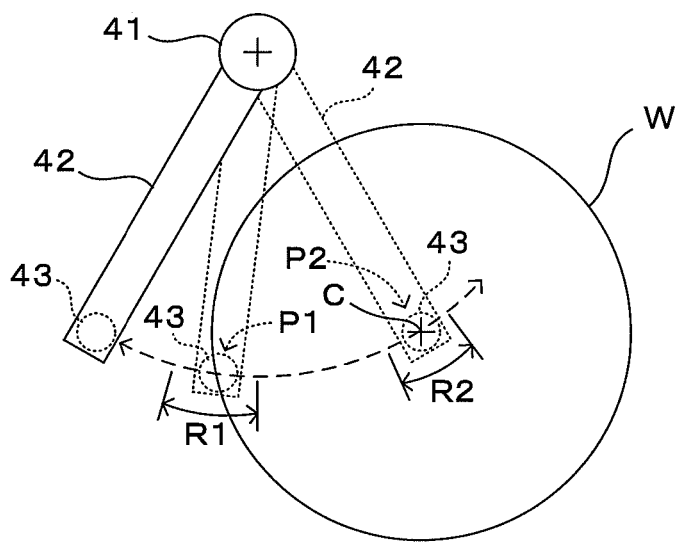

FIGS. 11A and 11B are diagrams showing some processing positions of the nozzle. More specifically, FIG. 11A is a diagram showing a relationship of a movement path of the nozzle and a reference position at an intermediate position of the movement path and FIG. 11B is a top view. As described above, the nozzle 43 horizontally moves while drawing an arcuate trajectory, and at least one reference position is set on that movement path. Here is described a case where the position P1 where the nozzle 43 is located right above the peripheral edge part of the substrate W on the side near the retracted position and the position P2 where the nozzle 43 is located right above the center of rotation C of the substrate W, which are both nozzle positions (processing positions) during the wet process, are the reference positions as shown in FIGS. 11A and 11B.

Note that the number and arrangement of the set reference positions are arbitrary. As described later, in this embodiment, the conversion formula is so determined that a relationship between the nozzle position in the image 12 and the nozzle position in the actual space is expressed with a certain accuracy near the set reference positions. Since the relationship of the nozzle position in the image 12 and the actual space is generally complicated as described above, a conversion formula accurately expressing the relationship of the both in the entire movement path is very complicated and unrealistic. On the other hand, the conversion formula is drastically simplified if a condition of guaranteeing accuracy only in ranges near the reference positions is given.

The conversion formula assuming such a condition naturally has lower accuracy with distance from the reference position. From this, it is desirable to set the reference position at or near the position of the nozzle (e.g. processing position) used in the actual process. If many reference positions are arranged in the movement path, it is possible to ensure the accuracy of position detection in a wider range. The number and arrangement of the set reference positions can be determined from these perspectives.

A predetermined range including the reference position P1 out of a movable range of the nozzle 43 along an arc is virtually defined as a neighborhood range R1 of the reference position P1. Further, a predetermined range including the reference position P2 out of the movable range is virtually defined as a neighborhood range R2 of the reference position P2. Although the neighborhood ranges R1, R2 are so set that the reference positions P1, P2 are centers thereof here, the reference positions may not be the centers of the neighborhood ranges. Further, the reference positions may be located at positions slightly deviated from the neighborhood ranges.

The spreads of the neighborhood ranges R1, R2 can be appropriately set according to ranges necessitating good position detection accuracy. For example, if the reference position is the processing position, the neighborhood range is preferably set to include at least the entire allowable range of the positional displacement of the nozzle 43 positioned at this processing position with the processing position as a center. Unless the reference position is the processing position, the neighborhood range can be arbitrarily set. Further, the size of the neighborhood range can be quantitatively expressed, for example, by any one of a length of the arc representing the movement path of the nozzle 43, a magnitude of an arc angle of the arc and a linear distance between opposite ends of the neighborhood range. In this embodiment in which the movement of the nozzle 43 is constrained to the one on the arc, methods for expressing the size of the neighborhood range are technically equivalent. The conversion formula from the position in the image 12 into the displacement amount in the actual space is so determined that the position of the nozzle 43 is accurately expressed in the neighborhood ranges R1, R2 set in this way.

Figure 12A:
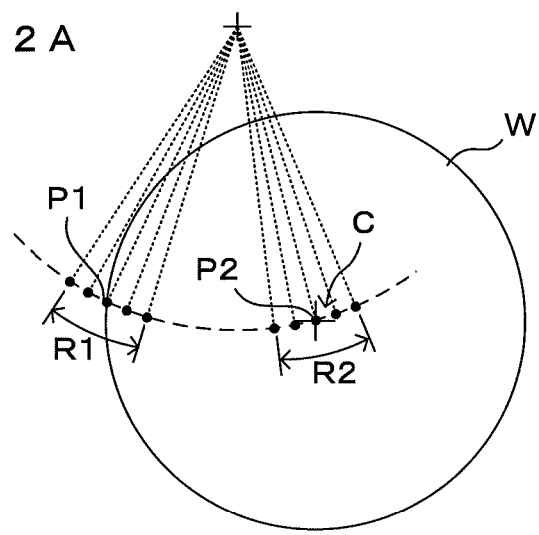
FIGS. 12A and 12B are drawings showing the principle of conversion formula calculation.
Figure 12B:
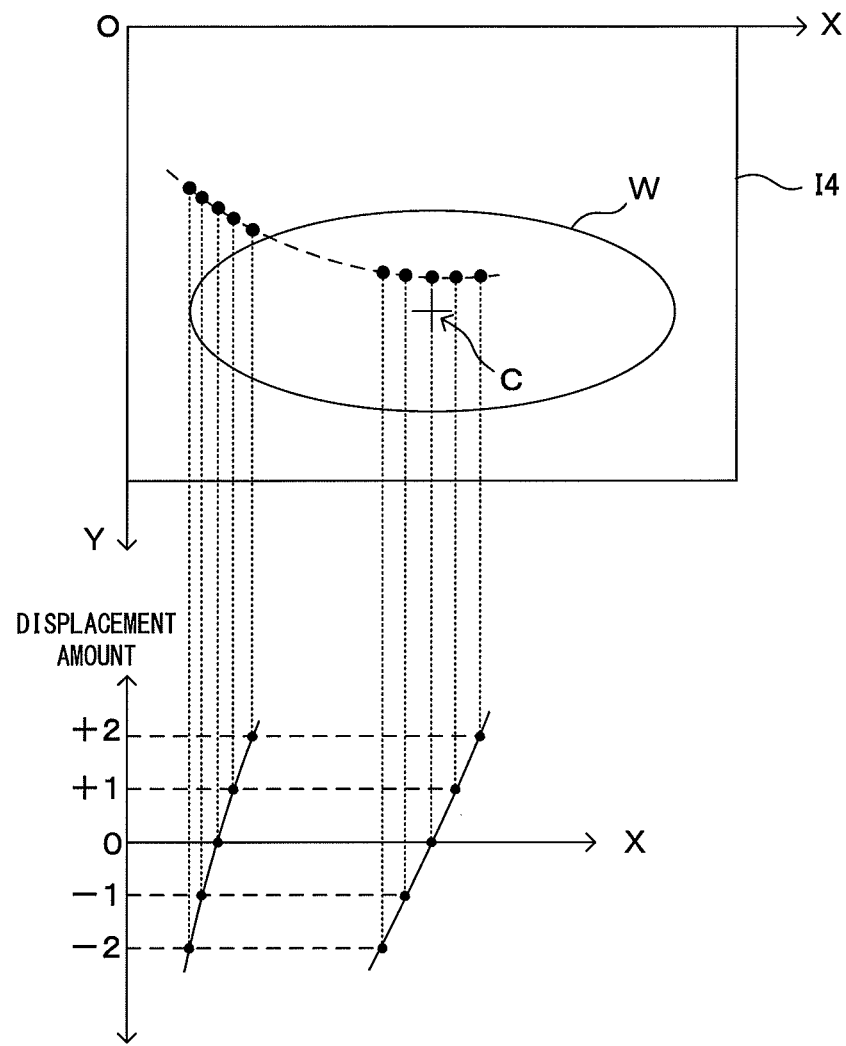

FIGS. 12A and 12B are drawings showing the principle of conversion formula calculation. As shown by black dots in FIG. 12A, a plurality of imaging positions are provided in each of the neighborhood ranges R1, R2 on the movement path of the nozzle 43. In this embodiment, imaging is performed every time while the position of the nozzle 43 is changed in a multi-step manner. Then, a correlation between the position of the nozzle 43 detected in the obtained image and the position of the nozzle 43 in the actual space when this image was imaged is obtained. The set position of the nozzle 43 in the actual space when this imaging is performed is the imaging position mentioned here.

In this example, the reference position P1 is one of the imaging positions and two imaging positions are set at each of opposite sides of the reference position P1 to be appropriately distributed in the neighborhood range R1. For example, the plurality of imaging positions can be set at equal angular intervals with respect to the rotation center of the arm 42, i.e. at equal intervals along the movement path of the nozzle 43. The number of the set imaging positions is arbitrary and the imaging positions need not always include the reference position. By increasing the number of samples by increasing the imaging positions, the accuracy of the conversion formula can be enhanced. For example, a positional displacement allowance of the nozzle is about (±2 mm) with respect to the determined processing position, an interval between the imaging positions can be set at about 0.5 mm.

When imaging is performed while the nozzle 43 is positioned at the plurality of imaging positions different from each other in this way, the position of the nozzle 43 successively changes along the movement path thereof in an obtained image 14 as shown by black dots in an upper part of FIG. 12B. If an X-coordinate of the nozzle position in the image 14 and a displacement amount of the nozzle 43 in the actual space are plotted, a nonlinear relationship generally appears between the both as shown in a lower part of FIG. 12B. Specifically, each point on a graph is connected by an appropriate curve. Note that the displacement amount taken on a vertical axis is expressed with each of the reference positions P1, P2 set as a starting point of displacement, the equally set interval between the imaging positions on an arc as a path of the nozzle 43 in the actual space set as 1 unit and a direction extending from a retracted position lateral to the substrate W toward the substrate center C (rightward direction in FIG. 12A) set as a "+direction".

Since the movement path of the nozzle 43 in the actual space is constrained to the one on the arc, the position of the nozzle 43 in the image 14 can be uniquely specified only by either one of the X-coordinate and the Y-coordinate. Although the position in the image 14 is expressed by an X-coordinate value here, it may be expressed by a Y-coordinate value. For example, as the trajectory is shown in broken line in FIG. 5, the nozzle 53 mainly largely moves in the Y direction in the image, whereas a movement in the X direction is small. In such a case, it is appropriate to express the position of the nozzle by a Y-coordinate value. Note that, depending on the movement of the nozzle in the image, it may not be possible to uniquely express the position of the nozzle by one coordinate in this way. In such a case, the position of the nozzle 43 needs to be naturally expressed by a combination of an X-coordinate value and a Y-coordinate value.

Such a curve representing a correlative relationship between the displacement amount of the nozzle 43 in the actual space and the X-coordinate in the image is expressed by an approximation formula. By doing so, the magnitudes of the displacements of the nozzle 43 from the reference positions P1, P2 in the actual space can be obtained by substituting an X-coordinate value of the nozzle position detected in an image obtained by imaging the nozzle 43 into that approximation formula. Thus, this approximation formula becomes a conversion formula for obtaining the nozzle displacement amount in the actual space from the nozzle position in the image. In the case of expressing the nozzle position in the image by a combination of an X-coordinate value and a Y-coordinate value, the approximation formula also uses the X-coordinate value and the Y-coordinate value as parameters, but a basic concept is the same.

Specific contents of a conversion formula calculation process based on the above principle are described below. This process is realized by the CPU 81 executing a processing program determined in advance and performed for one reference position of one nozzle. In other words, if a plurality of reference positions are set for one nozzle, the conversion formula calculation process is performed for each reference position. Further, if there are a plurality of nozzles for which the reference positions are set, a similar process is performed for each nozzle.

Figure 13:
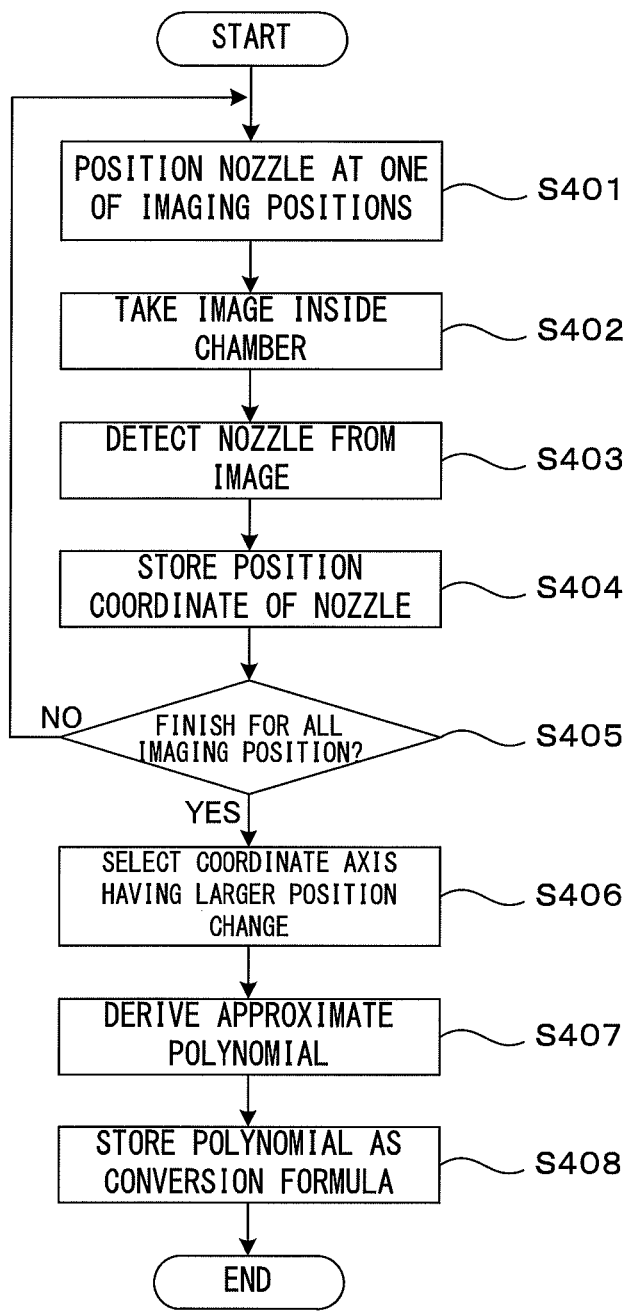
FIG. 13 is a flow chart showing the conversion formula calculation process.

FIG. 13 is a flow chart showing the conversion formula calculation process. First, the arm driver 83 rotates the arm 42 by a predetermined amount, whereby the nozzle 43 is positioned at one of the imaging positions (Step S401). In this state, the interior of the chamber 90 is imaged by the camera 72 (Step S402), the nozzle 43 is detected from an image by the image processor 86 (Step S403) and the position coordinates of the nozzle 43 are stored in the memory 82 (Step S404). Until the above process is finished for all the imaging positions (Step S405), imaging and nozzle position detection are performed while the imaging positions are successively switched.

As the imaging position changes, the position coordinates (X- and Y-coordinate values) of the nozzle 43 in the image successively change. Out of these, a coordinate axis having a larger change amount (difference between a maximum coordinate value and a minimum coordinate value) as a whole is selected (Step S406). By doing so, good accuracy can be ensured for the conversion formula by extending a dynamic range of position data.

A formula approximately expressing a correlation between the coordinate value of the nozzle position in the image and the displacement amount of the nozzle in the actual space on the selected coordinate axis is obtained as an appropriate polynomial (Step S407). The obtained polynomial is stored in the memory 82 as the conversion formula for this nozzle and this reference position (Step S408). If there are a plurality of reference positions or a plurality of nozzles, the above process is performed for each combination of these and those results are comprehensively stored as a correction table to be described later in the memory 82.

Since the relationship between the position coordinate of the nozzle in the image and the displacement amount of the nozzle in the actual space is generally nonlinear as described above, the conversion formula is preferably a polynomial having two or more degrees. As the number of degrees of the formula increases, the relationship of the both can be more accurately approximated. According to the knowledge of the inventors of this application, it is known to obtain practically sufficient accuracy by a polynomial having five to six degrees. An approximation polynomial can be obtained, for example, by using a known approximation calculation method such as a least squares method.

FIG. 14 is a drawing showing an example of the correction table. Here, a case where there are three nozzles specified by nozzle numbers 1, 2 and 3 and there are three reference positions specified by reference signs A, B and C for each nozzle is illustrated as an example here. However, these numbers are arbitrary. Further, the number of the reference positions may be different for each nozzle. Furthermore, besides data on the nozzles, data on other objects configured to be movable in the chamber 90 may also be included.

Conversion formulas F1$a$(X), F1$b$(X) and F1$c$(X) are respectively prepared for the positions A, B and C of the nozzle denoted by the nozzle number 1. These are expressed as functions of the X-coordinate value of the nozzle in the image. On the other hand, conversion formulas F2$a$(Y), F2$b$(Y) and F2$c$(Y) are respectively prepared for the positions A, B and C of the nozzle denoted by the nozzle number 2. These are expressed as functions of the Y-coordinate value of the nozzle in the image. Further, conversion formulas F3$a$(X, Y), F3$b$(X, Y) and F3$c$(X, Y) are respectively prepared for the positions A, B and C of the nozzle denoted by the nozzle number 3. These are expressed as functions having two variables, i.e. the X-coordinate value and the Y-coordinate value of the nozzle in the image. As just described, the conversion formulas obtained for each nozzle and each reference position are compiled into the correction table and stored in the memory 82.

In the nozzle position calculation process shown in FIG. 7, the conversion formula for conversion from the nozzle position detected in the image into the displacement amount in the actual space is used in Step S203. The conversion formula is effective only near the reference position and differs depending on a moving direction of the nozzle. Thus, a suitable conversion formula needs to be applied for each nozzle and each reference position. In Step S203, the correction table shown in FIG. 14 is referred to and the conversion formula corresponding to the currently focused nozzle and processing position is selected and used for the process. In this way, whether or not the nozzle position is proper can be precisely determined for each nozzle and each processing position.

The conversion formula calculation process described above is also performed before the substrate W is processed if necessary such as when a component inside the chamber 90 is exchanged, when a new component is mounted, during a new teaching operation and during a regular maintenance operation and the like beside before the shipment of the apparatus. Note that, in the case of changing a process recipe for substrates, the processing position, i.e. the position of the nozzle positioned when the substrate W is processed may be possibly changed according to this recipe change. At this time, unless the newly set processing position is in a range covered by the above conversion formula, a new conversion formula needs to be obtained for the vicinity of this processing position. If the conversion formulae are obtained for a plurality of reference positions in advance, a change of the process recipe can be easily dealt with.

As described above, in this embodiment, the nozzle position detected in the image obtained by imaging the inside of the chamber 90 can be evaluated by being converted into the nozzle displacement amount in the actual space inside the chamber 90. This conversion is not performed by a uniform operation, but the content of the operation is dynamically changed according to the nozzle position.

In the first conversion method, the displacement amount in the actual space is obtained by multiplying the nozzle displacement amount in the image by the conversion coefficient set according to the size of the nozzle taking up in the image. On the other hand, in the second conversion method, the conversion formula indicating the correspondence relationship between the position on the movement path of the nozzle and the position in the actual space is prepared in advance and the displacement amount in the actual space is derived from the nozzle position coordinates detected in the image using this conversion formula.

By adopting such a configuration, how much the nozzle is deviated from the proper processing position in the actual space can be accurately evaluated in this embodiment. Thus, in the substrate processing system 1 of this embodiment, a good processing result can be obtained by preventing a processing abnormality caused by the discharge of the processing liquid in a state where the nozzle is at an improper position.

The two conversion methods described above merely differ in the content of the operation and the necessary preparation process therefor, but apparatus configurations required for the implementation of the methods are not different at all. Thus, the both conversion methods can be implemented for the process in one substrate processing apparatus 1. In this case, how to use the two conversion methods is arbitrary.

The first conversion method for reflecting the size of the nozzle in the image on the conversion coefficient is particularly preferable when the size of the nozzle taking up in the image largely varies depending on the position of the nozzle. On the other hand, the second conversion method with which the conversion formulae between the position of the nozzle in the image and the displacement amount in the actual space are obtained in advance is preferable when the size of the nozzle in the image does not change very much depending on the nozzle position. From these, it is, for example, possible to use the first conversion method for such a nozzle that a distance thereof to the camera 72 largely changes during a movement along the movement path and use the second conversion method for such a nozzle that a change of a distance thereof to the camera 72 is small during a movement. Further, it is, for example, also possible to compare the two conversion methods for each nozzle beforehand and use the one having higher accuracy.

As described above, in this embodiment, each substrate processing unit 1A to 1D constituting the substrate processing system corresponds to a "displacement detecting apparatus" and a "substrate processing apparatus" of the invention. The nozzle 33, 43, 53 is a "positioning object" and an "imaging object" of the invention and has a function as a "nozzle" of the invention. Further, in the above embodiment, the arm 32, 42, 52 and the arm driver 83 function as a "mover" of the invention and the camera 72 functions as an "imager" of the invention. Further, the CPU 81 and the image processor 86 function as a "displacement detector" of the invention and the CPU 81 also functions as a "determiner" of the invention. Further, the memory 82 functions as a "storage" of the invention. Further, in the above embodiment, the spin chuck 11 functions as a "holder" of the invention. Further, the substrate W corresponds to a "work" of the invention.

Further, in the above embodiment, the conversion coefficient used in the process of FIG. 7 corresponds to a "coefficient" of the invention. Further, the reference matching pattern used in pattern matching corresponds to a "reference image" of the invention.

Note that the invention is not limited to the embodiment described above and various changes other than those described above can be made without departing from the gist of the invention. For example, in the first conversion method of the above embodiment, the conversion coefficients are set only for several processing positions determined in advance for each nozzle. However, needless to say, the conversion coefficient may be set for an arbitrary position on the movement path instead of this. In this case, a method may be such that conversion coefficients are calculated by performing imaging at many nozzle positions in advance or conversion coefficients obtained for discretely set processing positions are interpolated.

Further, although the second conversion method of the above embodiment is, for example, expressed as a conversion formula associating the nozzle position in the image and the displacement amount of the nozzle from the reference position in the actual space, the nozzle position in the image and the nozzle position in the actual space may be associated. In this case, the displacement amount of the nozzle can be calculated from the coordinates of the nozzle position and the reference position in the actual space obtained by conversion. Further, besides expression as a mathematical formula or function, conversion information can be expressed, for example, as a look-up table in which position coordinates in the image and a position in the actual space are associated one-to-one. Further, the conversion formula may be approximated by a broken line.

Further, since the invention is applied to detect the positional displacement of the nozzle attached to the tip of the swing arm in the above embodiment, the movement path of the nozzle is limited to the one on a virtual arc in a horizontal plane. Thus, the position of the nozzle and the presence or absence of the displacement in the space inside the chamber can be uniquely expressed only by a scalar quantity which is the displacement amount from the reference position. However, more generally, the nozzle is movable to an arbitrary position in the actual space and a configuration for moving and positioning a positioning object by an XY moving mechanism is also, for example, conceivable.

Even in such a case, conversion from the position detection result in the image into the position or the displacement from the reference position in the actual space is possible by applying the technical concept of the invention. In this case, the displacement can be expressed as a vector having a direction and a magnitude. Note that there are possibly cases where positioning objects located at different positions in an actual space appear at the same position in a two-dimensional image and the position in the actual space cannot be uniquely obtained from the image. Such a problem may be avoided, for example, by changing the arrangement of the camera.

Further, in the above embodiment, the image of the nozzle included in the image is detected by pattern matching and the nozzle as the "positioning object" of the invention is the "imaging object" of the invention. However, the "imaging object" of the invention needs not be the same as the "positioning object". Specifically, an object can function as the "imaging object" of the invention if it is integrally displaced as the positioning object is displaced and the position of the positioning object is uniquely obtained by detecting the position of that object. For example, a marker for position detection may be provided on the arm having the nozzle attached thereto and this can be used as the "imaging object". In this case, since the shape of the marker can be freely determined, position detection can be more simply performed by setting a shape easily detectable from an image as the shape of the marker.

Further, in the operation of the above embodiment, the nozzle position calculation process to which the displacement detecting method according to the invention is applied is adopted to detect the positional displacement of the camera 72 and detect the positional displacement of the substrate W. However, the invention can be carried out independently of these positional displacement detection processes.

Further, for example, the above-mentioned displacement detecting method using the nozzle as a positioning object can be implemented by the CPU 81 provided in the controller 80 of the substrate processing system 1 executing a predetermined control program. Thus, the invention can be distributed to the user as software for realizing the above process by being executed by the CPU 81.

Further, the above embodiment relates to the substrate processing unit for processing the substrate using the nozzle as the positioning object of the invention. However, an application range of the displacement detection technique of the invention is not limited to substrate processing. Specifically, various objects effectively acting by being positioned at predetermined positions can be used as positioning objects and applied to techniques in general for detecting displacements of such positioning objects.

As the specific embodiment is illustrated and described above, the displacement detector may be configured to search, in an image, an area equivalent to a reference image prepared in advance, for example, in correspondence with an imaging object and detect the position of the imaging object in the image. Such a searching technique is so-called a pattern matching technique and many techniques capable of detecting areas corresponding to a reference image from various images have been proposed thus far. By utilizing such techniques, the position of the imaging object in the image can be detected with high accuracy.

Further, for example, the storage may be provided which stores a relationship of the position of the imaging object in the image and the coefficient associated with this position, and the displacement detector may be configured to obtain a displacement amount of the positioning object based on the position of the imaging object in the image and the relationship stored in the storage. According to such a configuration, when the position of the imaging object is detected in the image, the displacement amount of the positioning object can be immediately obtained from the relationship stored in the storage. This eliminates the need to obtain the size of the imaging object in the image and the process can be simplified.

In this case, the relationship of the position of the imaging object and the coefficient may be obtained in advance based on a relationship of the position and size of the imaging object in images detected from a plurality of images obtained by the imager imaging the imaging object successively positioned at a plurality of positions by the mover. Further, in the displacement detecting method according to this invention, a step of determining the relationship of the position of the imaging object and the coefficient may be performed prior to the displacement detecting step, for example, based on the relationship of the position and size of the imaging object in images detected from a plurality of images obtained by the imager imaging the imaging object successively positioned at a plurality of positions by the mover. According to such a configuration, since the coefficient is determined from the images imaged in the actual apparatus, the displacement amount of the positioning object in the actual space inside the apparatus can be accurately obtained.

On the other hand, the displacement detecting apparatus and displacement detecting method according to this invention may be, for example, configured to detect the position of the imaging object in the image by searching, in the image, the area corresponding to the reference image prepared in advance in correspondence with the imaging object and set the coefficient according to the size of the detected imaging object. When such a pattern matching technique is used to detect the imaging object in the image, a ratio of the size of the area corresponding to the detected imaging object to the size of the reference image can serve as information indicating the size of the imaging object in the image. For example, if it is necessary to enlarge or reduce the reference image for the detection of the area by pattern matching, information relating to an enlargement rate or reduction rate can be used as the information indicating the size of the imaging object. In this case, the size of the imaging object needs not be calculated.

Further, for example, the displacement detector may be configured to detect the size of the imaging object detected in the image and set the coefficient based on a detection result. According to such a configuration, the size of the imaging object in the image needs to be obtained every time, but it is no longer necessary to perform a preparatory process for obtaining the coefficient beforehand.

Further, the substrate processing apparatus according to the invention may further include a determiner for determining whether or not the displacement amount with respect to the reference position of the nozzle detected by the displacement detector is larger than a predetermined allowable displacement amount. According to such a configuration, the process can be made different according to the displacement amount of the nozzle. For example, if a fluid is discharged from the nozzle only when the displacement amount of the nozzle is within the allowable displacement amount, a failure of the process due to the discharge of the fluid at an improper position can be prevented.

Further, for example, the nozzle may be provided with a cylindrical part and the displacement detector may be configured to detect a distance between both side surfaces of the cylindrical part from the image and set the coefficient according to that detection result. When the nozzle as the imaging object moves within an imaging visual field of the imager, the orientation of the nozzle with respect to the imager may vary. If the nozzle includes the cylindrical part, a diameter of the cylindrical part expressed by the distance between the both side surfaces of the cylindrical part can be utilized as information indicating the size of the nozzle even if the orientation with respect to the imager varies.

Further, the substrate processing apparatus according to this embodiment may include a holder for holding a work, a nozzle for discharging and supplying a fluid to the work, a mover for moving and positioning the nozzle, an imager for imaging an image including the nozzle or an object as an imaging object, the object displacing integrally with the nozzle as the nozzle is displaced, a displacement detector for detecting the imaging object from the image imaged by the imager and detecting a displacement of the nozzle based on the position of the imaging object detected in the image, and a determiner for determining whether or not a displacement amount of the nozzle detected by the displacement detector is larger than a predetermined allowable displacement amount, and the determiner may be configured to determine that the displacement amount is larger than the allowable displacement amount when a distance between the position of the imaging object and a predetermined reference position in the image is larger than a value obtained by multiplying the allowable displacement amount by a coefficient determined according to the size of the imaging object in the image.

In the substrate processing apparatus aiming to evaluate a displacement amount of a positioning object based on a magnitude relationship with an allowable displacement amount, it is not a prerequisite to obtain the value of the displacement amount of the positioning object itself. In such an apparatus, the aim thereof can be achieved by scaling the allowable displacement amount according to the size of the image in the image and comparing the displacement amount of the imaging object in the image and the scaled allowable displacement amount instead of converting the displacement amount in the image into the displacement amount in the actual space.

This invention can be applied to techniques in general for detecting displacements of various objects, which effectively act by being positioned at a predetermined position, as positioning objects.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A displacement detecting apparatus, comprising:
a mover which moves and positions a positioning object;
an imager which images an image including an imaging object which is the positioning object or an object displacing integrally with the positioning object as the positioning object is displaced; and
a displacement detector which detects the imaging object from the image imaged by the imager and detects a displacement of the positioning object based on the position of the imaging object detected in the image,
wherein the displacement detector obtains a displacement amount of the positioning object with respect to a predetermined reference position from a value obtained by multiplying a distance between the position of the imaging object and the reference position in the image by a coefficient determined according to size of the imaging object in the image;
further comprising a storage which stores a relationship of the position of the imaging object in the image and the coefficient associated with this position, wherein
the displacement detector obtains the displacement amount of the positioning object based on the position of the imaging object in the image and the relationship stored in the storage, and
wherein the relationship of the position of the imaging object and the coefficient is obtained in advance based on a relationship of the position and size of the imaging object in images detected from a plurality of images obtained by the imager imaging the imaging object successively positioned at a plurality of positions by the mover.

2. The displacement detecting apparatus according to claim 1, wherein:
a reference image corresponding to the imaging object is prepared in advance; and
the displacement detector detects the position of the imaging object in the image by searching an area equivalent to the reference image in the image.

3. The displacement detecting apparatus according to claim 2, wherein the displacement detector sets the coefficient based on a ratio of a size of the area equivalent to the reference image detected in the image to size of the reference image.

4. The displacement detecting apparatus according to claim 1, wherein the displacement detector sets the coefficient based on a detection result of detecting the size of the imaging object in the image.

5. A substrate processing apparatus, comprising:
a holder which holds a work to be processed;
a nozzle which discharges and supplies a fluid to the work; and
the displacement detecting apparatus according to the claim 1 using the nozzle as the positioning object.

6. The substrate processing apparatus according to claim 5, further comprising a determiner which determines whether or not the displacement amount with respect to the reference position of the nozzle detected by the displacement detector is larger than a predetermined allowable displacement amount.

7. The substrate processing apparatus according to claim 5, wherein:
- a cylindrical part is provided to the nozzle; and
- the displacement detector detects a distance between both side surfaces of the cylindrical part from the image and sets the coefficient according to that detection result.

8. A substrate processing apparatus, comprising:
- a holder which holds a work to be processed;
- a nozzle which discharges and supplies a fluid to the work;
- a mover which moves and positions the nozzle;
- an imager which images an image including an imaging object which is the nozzle or an object displacing integrally with the nozzle as the nozzle is displaced;
- a displacement detector which detects the imaging object from the image imaged by the imager and detects a displacement of the nozzle based on the position of the imaging object detected in the image; and
- a determiner determines that the displacement amount is larger than an allowable displacement amount when a distance between the position of the imaging object and a predetermined reference position in the image is larger than a value obtained by multiplying the allowable displacement amount by a coefficient determined according to a size of the imaging object in the image.

9. The substrate processing apparatus according to claim 8, wherein:
- a cylindrical part is provided to the nozzle; and
- the displacement detector detects a distance between both side surfaces of the cylindrical part from the image and sets the coefficient according to that detection result.

10. A displacement detecting method for detecting a displacement of a positioning object moved and positioned by a mover, the displacement detecting method comprising:
- imaging an image including an imaging object which is the positioning object or an object displacing integrally with the positioning object as the positioning object is displaced;
- detecting the imaging object from the image; and
- detecting a displacement of the positioning object with respective to a predetermined reference position based on the position of the imaging object detected in the image, wherein
- a displacement amount of the positioning object is obtained from a value obtained by multiplying a distance between the position of the imaging object and the reference position in the image by a coefficient determined according to size of the imaging object in the image; and
- further comprising, prior to detecting the displacement of the positioning object, determining a relationship of the position of the imaging object and the coefficient based on a relationship of the position and size of the imaging object in images detected from a plurality of images obtained by the imager imaging the imaging object successively positioned at a plurality of positions by the mover.

11. The displacement detecting method according to claim 10, wherein:
- a reference image corresponding to the imaging object is prepared in advance;
- the position of the imaging object in the image is detected by searching an area equivalent to the reference image in the image; and
- the coefficient is determined according to the size of the imaging object detected in the image.

12. A displacement detecting apparatus, comprising:
- a mover which moves and positions a positioning object;
- an imager which images an image including an imaging object which is the positioning object or an object displacing integrally with the positioning object as the positioning object is displaced; and
- a displacement detector which detects the imaging object from the image imaged by the imager and detects a displacement of the positioning object based on the position of the imaging object detected in the image,
- wherein the displacement detector obtains a displacement amount of the positioning object with respect to a predetermined reference position from a value obtained by multiplying a distance between the position of the imaging object and the reference position in the image by a coefficient determined according to size of the imaging object in the image,
- wherein a reference image corresponding to the imaging object is prepared in advance;
- wherein the displacement detector detects the position of the imaging object in the image by searching an area equivalent to the reference image in the image, and
- wherein the displacement detector sets the coefficient based on a ratio of a size of the area equivalent to the reference image detected in the image to size of the reference image.

13. A substrate processing apparatus, comprising:
- a holder which holds a work to be processed;
- a nozzle which discharges and supplies a fluid to the work; and
- a displacement detecting apparatus comprising:
- a mover which moves and positions a positioning object;
- an imager which images an image including an imaging object which is the positioning object or an object displacing integrally with the positioning object as the positioning object is displaced; and
- a displacement detector which detects the imaging object from the image imaged by the imager and detects a displacement of the positioning object based on the position of the imaging object detected in the image,
- wherein the displacement detector obtains a displacement amount of the positioning object with respect to a predetermined reference position from a value obtained by multiplying a distance between the position of the imaging object and the reference position in the image by a coefficient determined according to size of the imaging object in the image,
- wherein the positioning object is the nozzle, and
- further comprising a determiner which determines whether or not the displacement amount with respect to the reference position of the nozzle detected by the displacement detector is larger than a predetermined allowable displacement amount.

14. A substrate processing apparatus, comprising:
- a holder which holds a work to be processed;
- a nozzle which discharges and supplies a fluid to the work; and
- a displacement detecting apparatus comprising:
- a mover which moves and positions a positioning object;
- an imager which images an image including an imaging object which is the positioning object or an object displacing integrally with the positioning object as the positioning object is displaced; and
- a displacement detector which detects the imaging object from the image imaged by the imager and detects a displacement of the positioning object based on the position of the imaging object detected in the image, wherein the displacement detector obtains a displacement amount of the positioning object with respect to a predetermined reference position from a value obtained by multiplying a distance between the position of the imaging object and the reference position in the image by a coefficient determined according to size of the imaging object in the image, wherein the positioning object is the nozzle, wherein a cylindrical part is provided to the nozzle; and wherein the displacement detector detects a distance between both side surfaces of the cylindrical part from the image and sets the coefficient according to that detection result.

* * * * *